United States Patent
Kamakura et al.

(10) Patent No.: US 10,978,310 B2
(45) Date of Patent: Apr. 13, 2021

(54) METHOD OF MANUFACTURING SEMICONDUCTOR DEVICE AND NON-TRANSITORY COMPUTER-READABLE RECORDING MEDIUM CAPABLE OF ADJUSTING SUBSTRATE TEMPERATURE

(71) Applicant: Kokusai Electric Corporation, Tokyo (JP)

(72) Inventors: Tsukasa Kamakura, Toyama (JP); Mitsuro Tanabe, Toyama (JP); Naofumi Ohashi, Toyama (JP); Eisuke Nishitani, Toyama (JP); Tadashi Takasaki, Toyama (JP); Shun Matsui, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/294,479

(22) Filed: Mar. 6, 2019

(65) Prior Publication Data
US 2019/0295854 A1  Sep. 26, 2019

(30) Foreign Application Priority Data
Mar. 26, 2018  (JP) .............................. JP2018-057985

(51) Int. Cl.
*H01L 21/324* (2006.01)
*H01L 21/687* (2006.01)
(Continued)

(52) U.S. Cl.
CPC ........ *H01L 21/324* (2013.01); *H01L 21/0217* (2013.01); *H01L 21/02164* (2013.01);
(Continued)

(58) Field of Classification Search
CPC .......... C23C 16/45544; C23C 16/4586; C23C 16/52; H01L 21/02164; H01L 21/0217;
(Continued)

(56) References Cited

U.S. PATENT DOCUMENTS

2008/0233269 A1\* 9/2008 Carcasi ................. B05D 1/005
                                                          427/9
2010/0240223 A1   9/2010 Ito et al.
(Continued)

FOREIGN PATENT DOCUMENTS

JP    09-298204 A      11/1997
JP    2002-302771 A    10/2002
(Continued)

OTHER PUBLICATIONS

Office Action in corresponding Korean Application No. 10-2019-0022247, dated Mar. 13, 2020, with English translation.
(Continued)

*Primary Examiner* — Duy T Nguyen
(74) *Attorney, Agent, or Firm* — Edell, Shapiro & Finnan, LLC

(57) ABSTRACT

Described herein is a technique capable of improving a quality of a substrate processing. According to one aspect of the technique described herein, there is provided a method of manufacturing a semiconductor device including: (a) receiving substrate data including at least one of a stacked number of layers of a device formed on a substrate and a structure of the device; (b) setting an apparatus parameter corresponding to the substrate data; (c) supporting the substrate corresponding to the substrate data above a substrate support; (d) elevating a temperature of the substrate based on the apparatus parameter while the substrate is separated from a surface of the substrate support; (e) placing
(Continued)

the substrate on the substrate support after (d); and (f) processing the substrate in a process chamber.

17 Claims, 17 Drawing Sheets

(51) Int. Cl.
    *H01L 21/285*    (2006.01)
    *H01L 21/02*     (2006.01)
    *H01L 21/67*     (2006.01)

(52) U.S. Cl.
    CPC .. *H01L 21/28506* (2013.01); *H01L 21/67103* (2013.01); *H01L 21/68707* (2013.01); *H01L 21/68742* (2013.01); *H01L 21/67017* (2013.01)

(58) Field of Classification Search
    CPC ............. H01L 21/28506; H01L 21/324; H01L 21/67017; H01L 21/67103; H01L 21/67248; H01L 21/68707; H01L 21/68742; H01L 27/115; H01L 27/11556; H01L 27/11582
    USPC ........................................................ 438/758
    See application file for complete search history.

(56) References Cited

U.S. PATENT DOCUMENTS

| | | | |
|---|---|---|---|
| 2015/0371883 A1* | 12/2015 | Takahashi | ......... H01L 21/67259 438/5 |
| 2016/0230280 A1 | 8/2016 | Matsui et al. | |
| 2016/0318148 A1 | 11/2016 | Turovets | |
| 2017/0040232 A1* | 2/2017 | Nakayama | ........ H01L 21/30625 |
| 2017/0159181 A1* | 6/2017 | Toyoda | ................. C23C 16/345 |
| 2018/0029189 A9 | 2/2018 | Turovets | |

FOREIGN PATENT DOCUMENTS

| | | |
|---|---|---|
| JP | 2005-032990 A | 2/2005 |
| JP | 2007-067196 A | 3/2007 |
| JP | 2008-218490 A | 9/2008 |
| JP | 2009-088314 A | 4/2009 |
| JP | 2010-225760 A | 10/2010 |
| JP | 2012-142397 A | 7/2012 |
| JP | 2016-146393 A | 8/2016 |
| JP | 2017-503673 A | 2/2017 |

OTHER PUBLICATIONS

Office Action in corresponding Japanese Application No. 2018-057985, dated Nov. 1, 2019, with English translation.

* cited by examiner

FIG. 5

APPARATUS PARAMETER OF FIRST TEMPERATURE ELEVATING STEP S302a

APPARATUS PARAMETER OF SECOND TEMPERATURE ELEVATING STEP S302b

FIG. 17

| SUBSTRATE DATA [NUMBER OF LAYERS] / APPARATUS PARAMETER | 1 [32] | 2 [50] | 3 [64] | 4 [...] | 5 [...] | - |
|---|---|---|---|---|---|---|
| PRESET VALUE | FIRST PRESET VALUE | SECOND PRESET VALUE | THIRD PRESET VALUE | FOURTH PRESET VALUE | FIFTH PRESET VALUE | CURRENT STATE |
| NEUTRALIZATION TIME [SEC] | 0.1 | 0.5 | 1.0 | 1.5 | 2.0 | 1.0 |

METHOD OF MANUFACTURING SEMICONDUCTOR DEVICE AND NON-TRANSITORY COMPUTER-READABLE RECORDING MEDIUM CAPABLE OF ADJUSTING SUBSTRATE TEMPERATURE

CROSS REFERENCE TO RELATED APPLICATIONS

This application claims foreign priority under 35 U.S.C. § 119(a)-(d) to Application No. JP 2018-057985 filed on Mar. 26, 2018, the entire contents of which are hereby incorporated by reference.

TECHNICAL FIELD

The present disclosure relates to a method of manufacturing a semiconductor device and a non-transitory computer-readable recording medium.

BACKGROUND

As one of manufacturing processes of a semiconductor device, a substrate processing (film-forming process) of forming a film on a substrate by supplying process gases to the substrate may be performed.

However, a quality of the substrate processing may be deteriorated by a device structure formed on the substrate.

SUMMARY

Described herein is a technique capable of improving the quality of the substrate processing.

According to one aspect of the technique described herein, there is provided a method of manufacturing a semiconductor device including: (a) receiving substrate data including at least one of a stacked number of layers of a device formed on a substrate and a structure of the device; (b) setting an apparatus parameter corresponding to the substrate data; (c) supporting the substrate corresponding to the substrate data above a substrate support; (d) elevating a temperature of the substrate based on the apparatus parameter while the substrate is separated from a surface of the substrate support; (e) placing the substrate on the substrate support after (d); and (f) processing the substrate in a process chamber.

BRIEF DESCRIPTION OF THE DRAWINGS

FIG. 5 schematically illustrates a vertical cross-section of a substrate processing apparatus preferably used in one or more embodiments described herein.

FIG. 17 schematically illustrates still another exemplary apparatus parameter table according to the embodiments described herein.

DETAILED DESCRIPTION

Embodiments

Hereinafter, one or more embodiments according to the technique will be described.

Figure 2A:
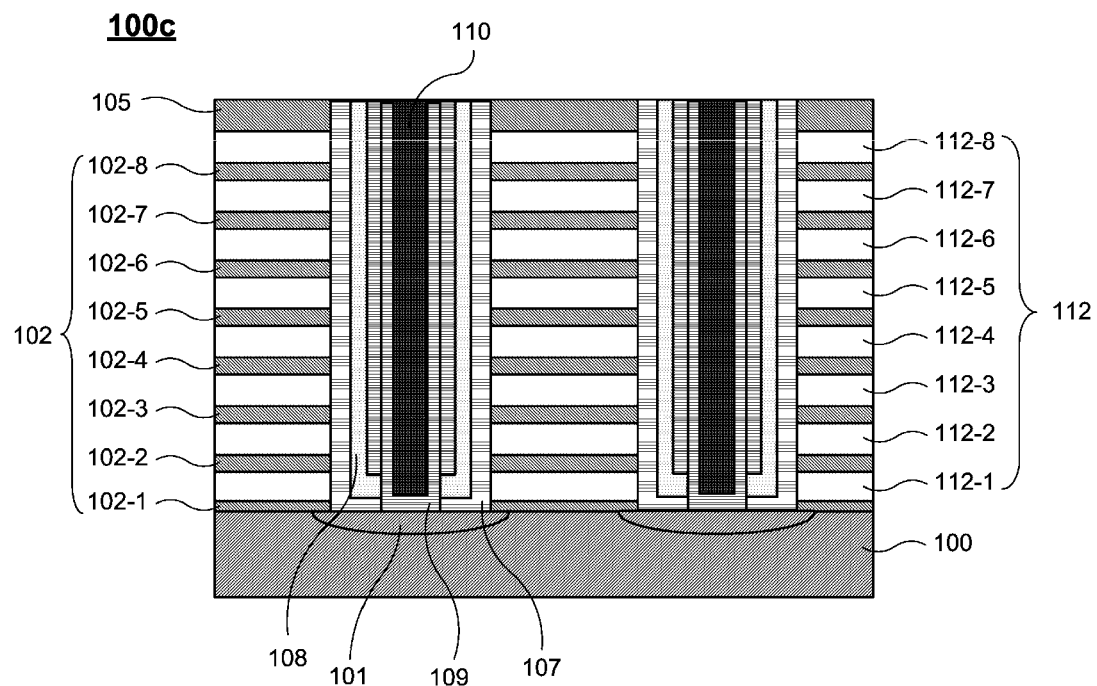
FIGS. 2A and 2B schematically illustrate a processing state of the substrate, respectively, according to the embodiments described herein.
Figure 2B:
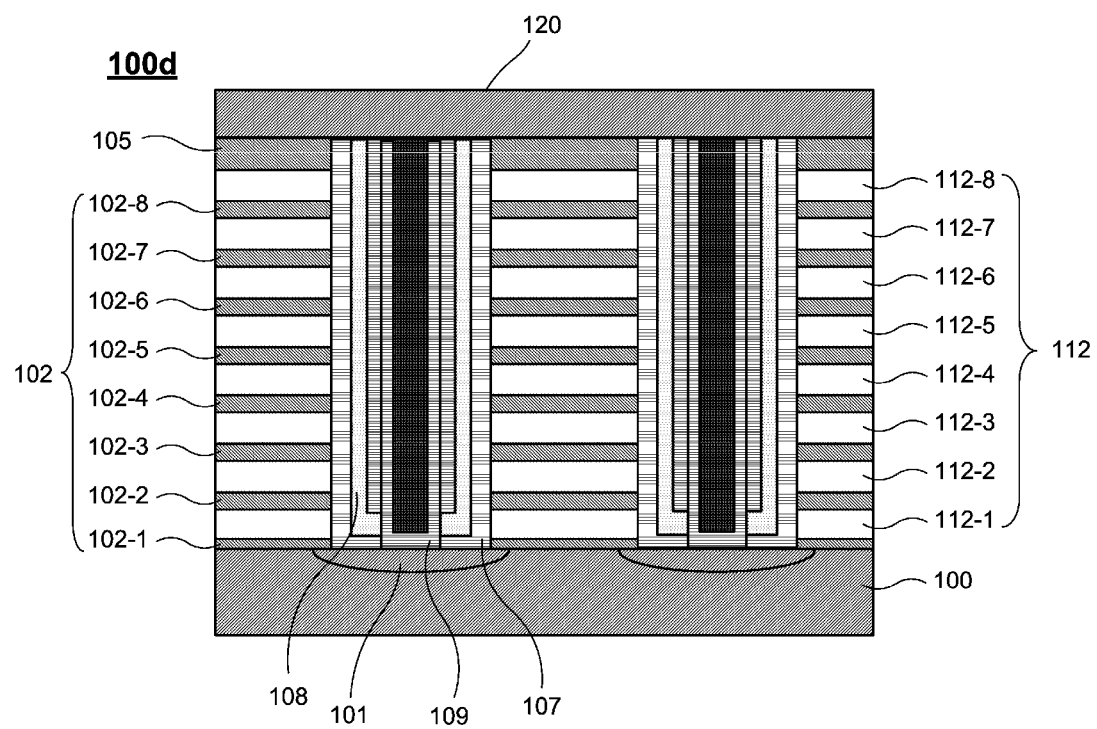
Figure 3A:
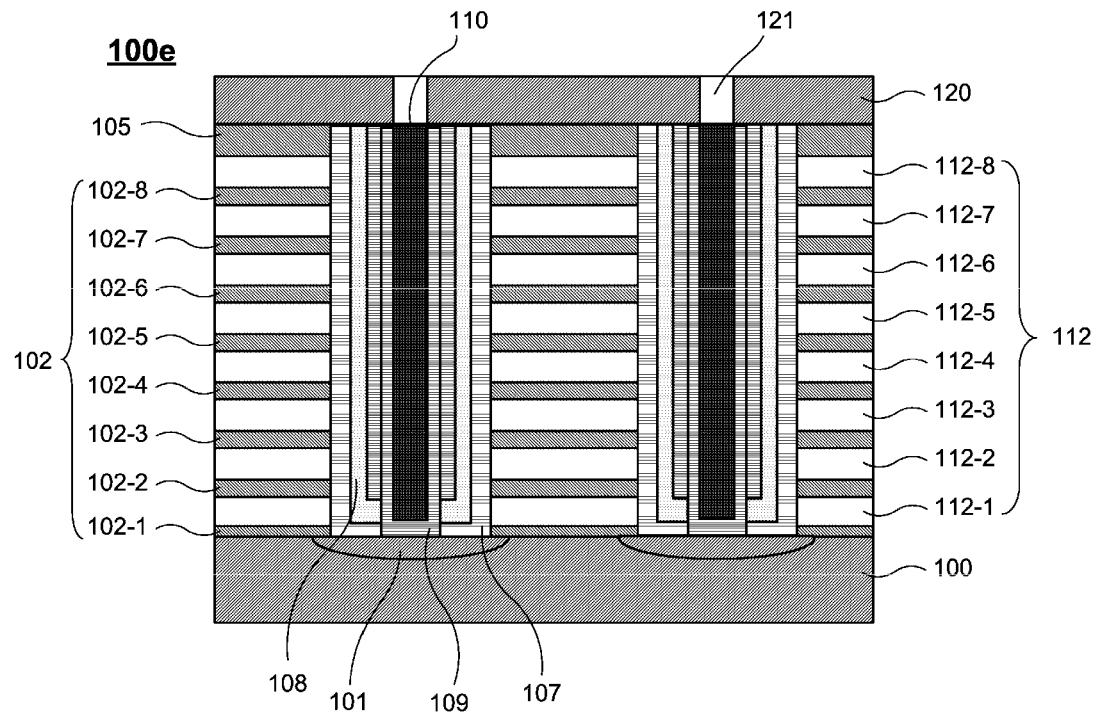
FIGS. 3A and 3B schematically illustrate a processing state of the substrate, respectively, according to the embodiments described herein.
Figure 3B:
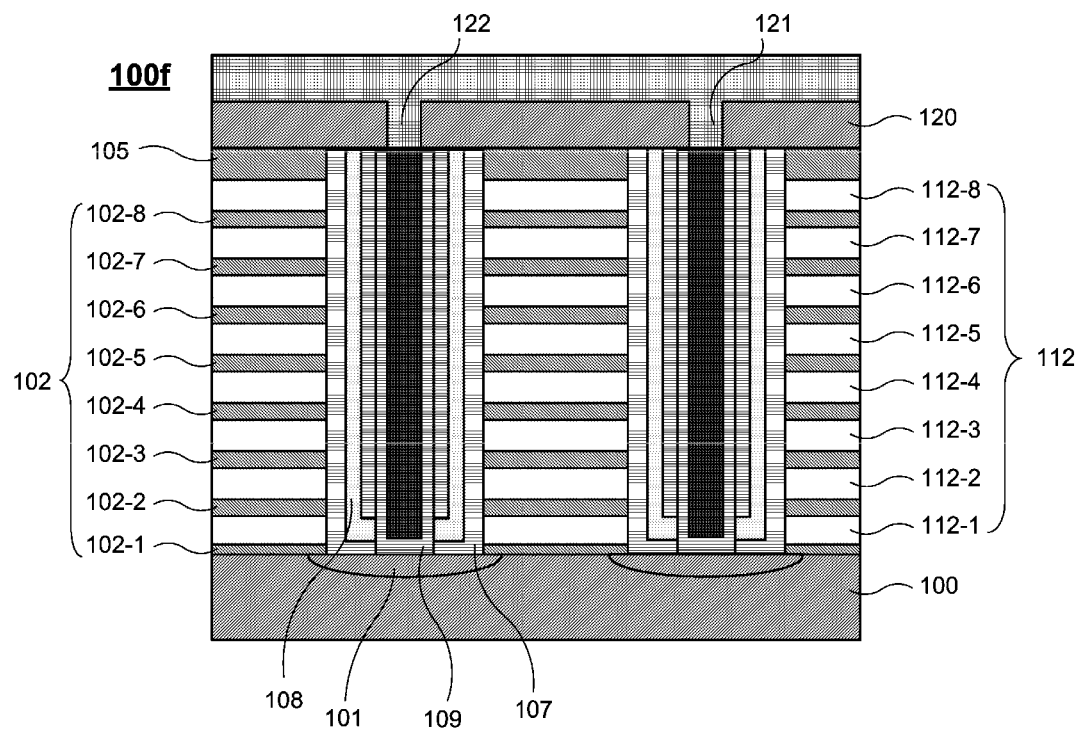

A manufacturing process of a semiconductor device will be described with reference to FIGS. 1A through 4. A semiconductor device having a three-dimensional structure in which electrodes are formed three-dimensionally is formed according to an exemplary process shown in FIG. 4. The semiconductor device has a multilayer structure in which an insulating film 102 and a conductive film 112 are alternately stacked on a substrate 100 as shown in FIGS. 3A and 3B. Hereinafter, the process of forming the semiconductor device and the multilayer structure will be described in detail with reference to FIGS. 1A, 1B, 2A, 2B, 3A, 3C and 4.

A common source line (CSL) 101 is formed on the substrate 100. The substrate 100 may also be referred to as a wafer or a semiconductor wafer. In a stacked insulating films forming step S102, the insulating film 102 and the sacrificial film 103 are stacked on the substrate 100. The insulating film 102 is constituted by a silicon oxide film (hereinafter, also referred to as an "SiO film"). The SiO film is formed by supplying a silicon-containing gas containing silicon (Si) component as a main component and an oxygen-containing gas containing oxygen (O) component as a main component onto the substrate 100 while heating the substrate 100 to a predetermined temperature.

The sacrificial film 103 is removed in a sacrificial film removing step S110 to be described later, and has etching selectivity with respect to the insulating film 102. In the present specification, "the sacrificial film 103 has the etching selectivity with respect to the insulating film 102" means that the sacrificial film 103 is etched when it is exposed to an etching solution while the insulating film 102 is not etched. The sacrificial film 103 is constituted by, for example, a silicon nitride film (hereinafter, also referred to as an "SiN film"). For example, the SiN film is formed by supplying the silicon-containing gas containing silicon (Si) component as a main component and a nitrogen-containing gas containing nitrogen (N) component as a main component onto the substrate 100 while heating the substrate 100 to a predetermined temperature.

Stacked Insulating Films Forming Step S102

Figure 1A:
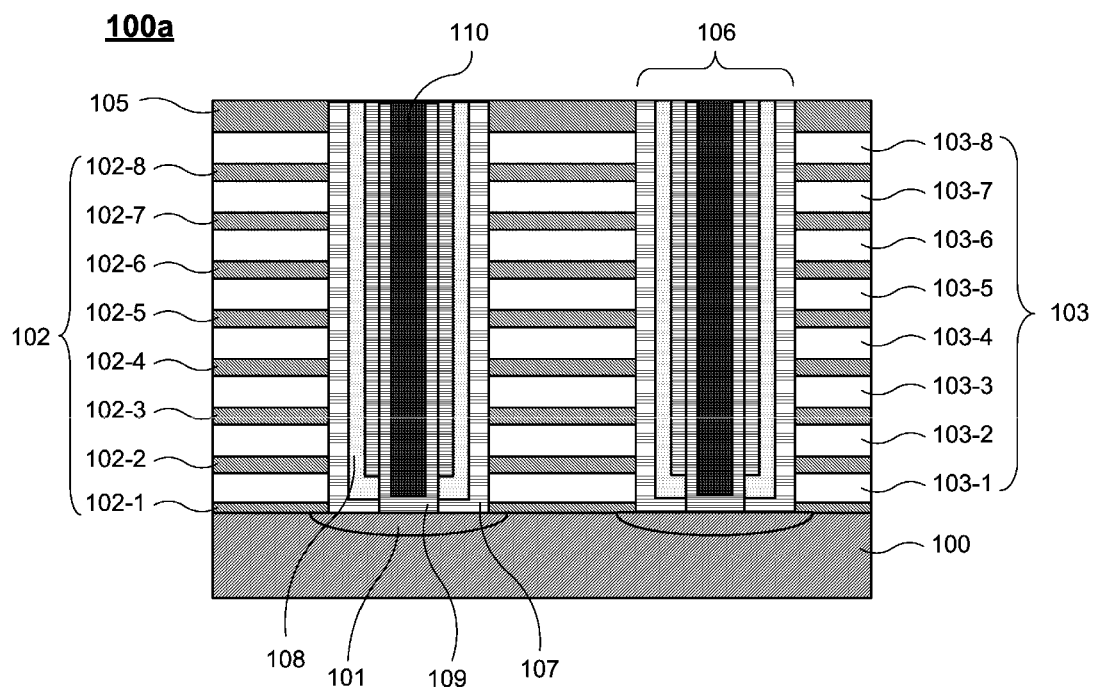
FIGS. 1A and 1B schematically illustrate a processing state of a substrate, respectively, according to one or more embodiments described herein.

By forming the insulating film 102 and the sacrificial film 103 alternately a predetermined number of times, the stacked insulating films 102 and 103 shown in FIG. 1A are formed. In the embodiments, for example, 8 layers of the insulating film 102 (that is, insulating films 102-1, 102-2, 102-3, 102-4, 102-5, 102-6, 102-7 and 102-8) and 8 layers of the sacrificial film 103 (that is, sacrificial films 103-1, 103-2, 103-3, 103-4, 103-5, 103-6, 103-7 and 103-8) are alternately formed. That is, the insulating films 102-1, 102-2, 102-3, 102-4, 102-5, 102-6, 102-7 and 102-8 are formed in this order from the bottom to the top of the insulating film 102, and the sacrificial films 103-1, 103-2, 103-3, 103-4, 103-5, 103-6, 103-7 and 103-8 are formed in this order from the bottom to the top of the sacrificial film 103. While 8 layers of the insulating film 102 (that is, the insulating films 102-1, 102-2, 102-3, 102-4, 102-5, 102-6, 102-7 and 102-8) and 8 layers of the sacrificial film 103 (that is, the sacrificial films 103-1, 103-2, 103-3, 103-4, 103-5, 103-6, 103-7 and 103-8) are alternately formed as shown in FIG. 1A, the embodiments are not limited thereto. For example, the number of layers (the stacked number of layers) of the insulating film 102 and the sacrificial film 103 may be, for example, 16, 25, 32, 48, 50, 64 and 72.

Second Insulating Film Forming Step S104

A second insulating film 105 is formed on the uppermost sacrificial film 103-8. The second insulating film 105 may be simply referred to as an insulating film 105. The insulating film 105 is formed by the same method as the insulating film 102. The insulating film 105 is thicker than each of the insulating films 102-1, 102-2, 102-3, 102-4, 102-5, 102-6, 102-7 and 102-8.

Hole Forming Step S106

Subsequently, the hole forming step S106 is performed on the stacked insulating films 102 and 103 and the second insulating film 105 to form a plurality of channel holes 106.

Hole Filling Step S108

After the plurality of channel holes 106 are formed, the hole filling step S108 is performed. In the hole filling step S108, a protective film 107, a stacked film 108 (that is, a stacked film of a gate electrode insulating film, a charge trapping film and a tunnel insulating film) and channel films 109 and 110 are formed in the plurality of channel holes 106 from the side wall surfaces toward the centers of the plurality of channel holes 106. The channel films 109 and 110 are configured to be connected to the CSL 101.

Sacrificial Film Removing Step S110

Figure 1B:
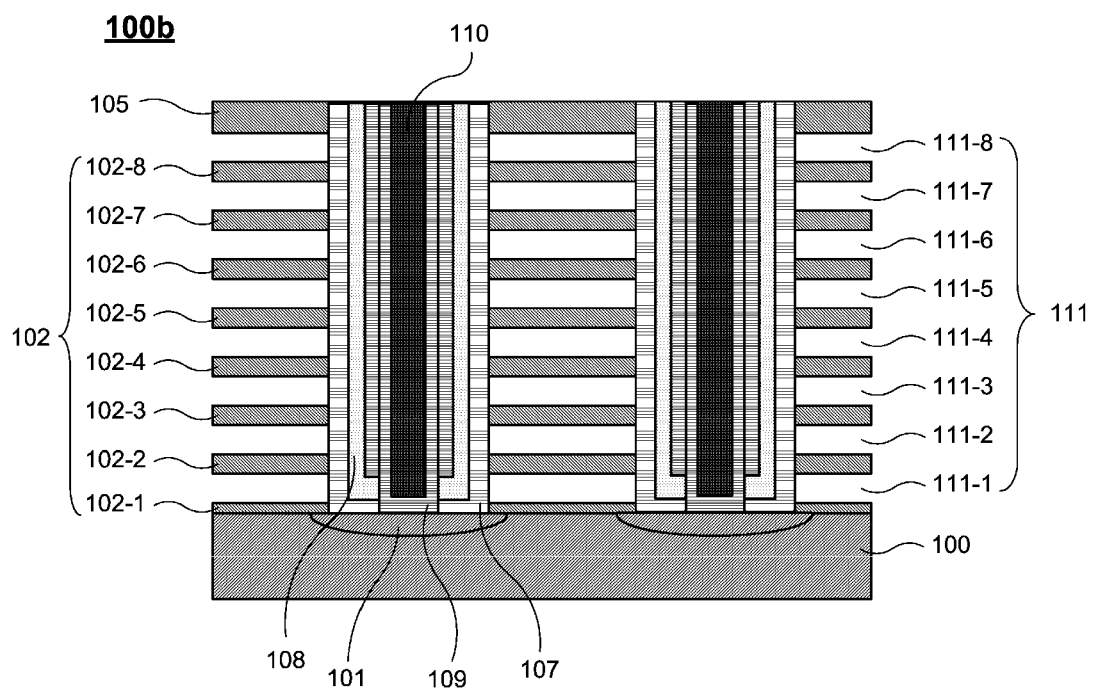

The sacrificial film removing step S110 is performed on the substrate 100 and the structure formed thereon shown in FIG. 1A. Hereinafter, a processing state with the substrate 100 and the structure formed thereon shown in FIG. 1A are referred to as a "substrate 100a". The same also applies to the substrate 100 and the films formed the structure formed thereon shown in FIGS. 1B through 3B. For example, a processing state with the substrate 100 and the structure formed thereon shown in FIG. 1B are referred to as a substrate 100b. As a result, the sacrificial film 103 is removed as shown in FIG. 1B. By removing the sacrificial film 103, a void 111 is provided in the substrate 100b at a position where the sacrificial film 103 is removed. That is, voids 111-1, 111-2, 111-3, 111-4, 111-5, 111-6, 111-7 and 111-8 are provided at positions where the sacrificial films 103-1 through 103-8 are removed.

Conductive Film Forming Step S112

Subsequently, the conductive film forming step S112 is performed on the substrate 100b shown in FIG. 1B. As a result, the conductive film 112 serving as an electrode later is formed in the void 111. That is, conductive films 112-1, 112-2, 112-3, 112-4, 112-5, 112-6, 112-7 and 112-8 are formed in this order from the bottom to the top of the conductive film 112. A substrate 100c after the conductive film forming step S112 is performed is shown in FIG. 2A. The conductive film 112 is made of a material such as tungsten, for example.

Third Insulating Film Forming Step S114

Subsequently, a third insulating film 120 is formed on the substrate 100c shown in FIG. 2A. A substrate 100d after the third insulating film 120 is performed is shown in FIG. 2B. The third insulating film 120 is formed by the same method as the insulating film 102 or the second insulating film 105.

Contact Hole Forming Step S116

Subsequently, a plurality of contact holes 106 is formed in the third insulating film 120 of the substrate 100d shown in FIG. 2B. A substrate 100e after the contact hole forming step S116 is performed is shown in FIG. 3A.

Contact Film Forming Step S118

Subsequently, a contact plug film 122 is formed on the substrate 100e shown in FIG. 3A. A substrate 100f after the contact film forming step S118 is performed is shown in FIG. 3B. The contact plug film 122 is formed so as to fill the inside of the plurality of contact holes 106 and to be electrically connected to the channel film 110. For example, the contact plug film 122 is constituted by a film containing tungsten (W).

The semiconductor device is formed according to the above-described process. However, the configuration shown in the substrate 100f of FIG. 3B does not represent a final structure of the semiconductor device. The configuration shown in the substrate 100f only represents an exemplary structure of the semiconductor device during the formation of the semiconductor device.

The inventors of the present application found that at least one of the following problems i) through v) occurs when a substrate processing described later is performed using the substrate 100 formed by the process described above or using one of the substrates 100a through 100f formed by each step of the process, respectively.

i) As the number of layers of the stacked insulating films increases in the stacked insulating films forming step S102, the distortion of the substrate in temperature elevating steps, a film-forming process and a temperature lowering step performed by a substrate processing apparatus described later also increases.

ii) As the number of layers of the stacked insulating films increases, the distortion of the substrate increases and the filling density in the plurality of channel holes 106 decreases.

iii) As the number of layers of the stacked insulating films increases, the distortion of the substrate increases. In addition, the uniformity of the thickness of the protective film 107 or the stacked film 108 from upper ends to lower ends of the plurality of channel holes 106 decreases.

iv) As the number of layers of the stacked insulating films increases, the distortion of the substrate increases. In particular, the distortion of the substrate increases during the formation of the contact plug film 122 on the substrate 100c.

v) When a plasma process is performed on the substrate 100, the amount of electric charges in the substrate 100 increases, that is, a charge-up problem may occur. A charge-up damage may occur according to the charge-up problem. In addition, a clamping strength applied to a substrate support part 210 described later also increases.

The problems described above become more apparent as the number of layers of the stacked insulating films such as the insulating film 102 formed on the substrate 100 increases.

As a result of intensive research, the inventors of the present application have confirmed that, by adjusting a temperature elevating rate or a temperature lowering rate (that is, the cooling rate) of the substrate 100 based on at least one of substrate data and apparatus parameter data described later when the substrate 100 is processed by the substrate processing apparatus described later, it is possible to suppress the distortion of the substrate 100, and as a result, it is possible to form a film uniformly. Hereinafter, the structure of the substrate processing apparatus and the substrate processing according to the embodiments will be described.

First, the structure of the substrate processing apparatus will be described with reference to FIGS. 5, 6 and 7.

Substrate Processing Apparatus

A substrate processing apparatus 200 preferably used in one or more embodiments described herein includes a process vessel 202. For example, the process vessel 202 is a flat and sealed vessel having a circular horizontal cross-section. A process chamber 201 where the substrate 100 such as a silicon wafer is processed and a transfer chamber 203 are provided in the process vessel 202. The process vessel 202 is constituted by an upper vessel 202a and a lower vessel 202b. A partition part (also referred to as a "partition plate") 204 is provided between the upper vessel 202a and the lower vessel 202b. A chamber surrounded by the upper vessel 202a and defined by a space above the partition part 204 is referred to as the process chamber 201. A chamber surrounded by the lower vessel 202b and defined by a space below the partition part 204 is referred to as the transfer chamber 203.

Figure 4:
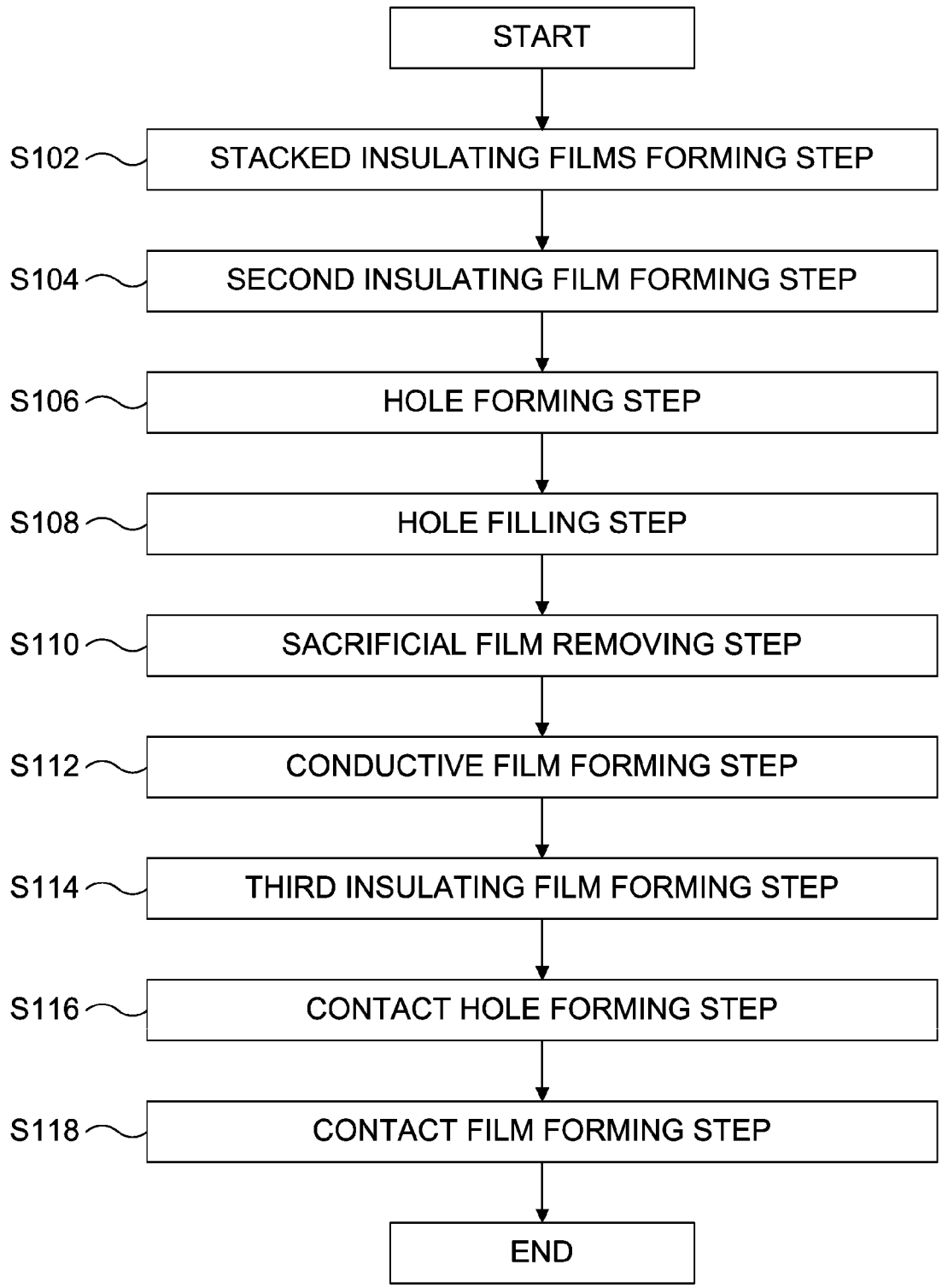
FIG. 4 schematically illustrates a flow of manufacturing a semiconductor device according to the embodiments described herein.

A substrate loading/unloading port 1480 is provided on a side surface of the lower vessel 202b adjacent to a gate valve 1490. The substrate 100 is moved between a vacuum transfer chamber 2400 shown in FIG. 16 and the transfer chamber 203 through the substrate loading/unloading port 1480. Lift pins 207 are provided at the bottom of the lower vessel 202b. The lift pins 207 may be fixed to the bottom of the lower vessel 202b. However, as shown in FIG. 4, the lift pins 207 may be connected to a lift pin position adjusting part 208 through the bottom of the lower vessel 202b. The lift pin position adjusting part 208 is constituted by a driving part 208a and a lift pin support 208b. The driving part 208a may transmit and receive height data (position data) of the lift pins 207 to and from a controller 260 described later. Since the lift pins 207 are in direct contact with the substrate 100, the lift pins 207 are preferably made of a material such as quartz and alumina. In addition, the height data of the lift pins 207 may be one of apparatus parameters described later.

The lift pin position adjusting part 208 may be connected to the earth 208c. By connecting the lift pins 207 to the ground potential, it is possible to neutralize the substrate 100 (that is, to remove electric charges from the substrate 100) by the lift pins 207 even when the substrate 100 is charged with electric charges. To neutralize the substrate 100, the lift pins 207 are preferably made of a conductive material. By using a conductive material as the lift pins 207, it is possible to improve the performance of neutralizing the substrate 100.

The substrate support part 210 configured to support the substrate 100 is provided in the process chamber 201. The substrate support part 210 mainly includes a substrate support 212 having a substrate placing surface 211 on which the substrate 100 is placed and a heater 213 serving as a heating mechanism (also referred to as a "heating apparatus"). Through-holes (also referred to as holes) 214 through which the lift pins 207 penetrate are provided at positions of the substrate support 212 corresponding to the lift pins 207. In addition, the heater 213 is connected to a temperature controller 400. The temperature of the heater 213 is controlled by the temperature controller 400. The temperature of the heater 213 is measured by a temperature sensor 401 provided near the heater 213. Temperature data of the heater 213 is generated by the temperature controller 400 by analog/digital conversion of the temperature of the heater 213 measured by the temperature sensor 401. The temperature controller 400 is configured to transmit the temperature data of the heater 213 to the controller 260 described later. In addition, a bias electrode 256 configured to apply a bias to the substrate 100 or the process chamber 201 may be provided in the substrate support 212. The bias electrode 256 is electrically connected to a bias controller 257. The bias controller 257 is configured to adjust the bias. The bias controller 257 is configured to transmit and receive a bias value (bias data) to and from the controller 260 described later. In addition, the bias controller 257 may be configured so that the substrate 100 is not charged with electric charges. For example, when the substrate 100 is charged to a negative potential, the voltage bias is adjusted (controlled) by the bias controller 257 so that the bias electrode 256 has a negative potential.

The substrate support 212 is supported by a shaft 217. The shaft 217 penetrates the bottom of the process vessel 202 and is connected to an elevating mechanism 218 at the outside of the process vessel 202. The substrate 100 placed on the substrate placing surface 211 of the substrate support 212 may be elevated and lowered by operating the elevating mechanism 218 by elevating and lowering the shaft 217 and the substrate support 212. A bellows 219 covers a lower end portion of the shaft 217 to maintain the process chamber 201 airtight. The elevating mechanism 218 is configured to transmit and receive height data (position data) of the substrate support 212 to and from the controller 260 described later. At least two or more of the positions of the substrate support 212 may be set as the height data (position data) of the substrate support 212. Preferably, the positions of the substrate support 212 may be set flexibly. For example, the positions of the substrate support 212 may include a substrate processing position, a substrate transfer position such as a substrate loading position and a substrate unloading position, a temperature elevating position and a temperature lowering position. In addition, the height data of the substrate support 212 may be one of the apparatus parameters described later. The height (position) of the substrate support 212 is defined by, for example, the distance from the bottom surface of the lower vessel 202b to the top surface of the substrate support 212.

Figure 10:
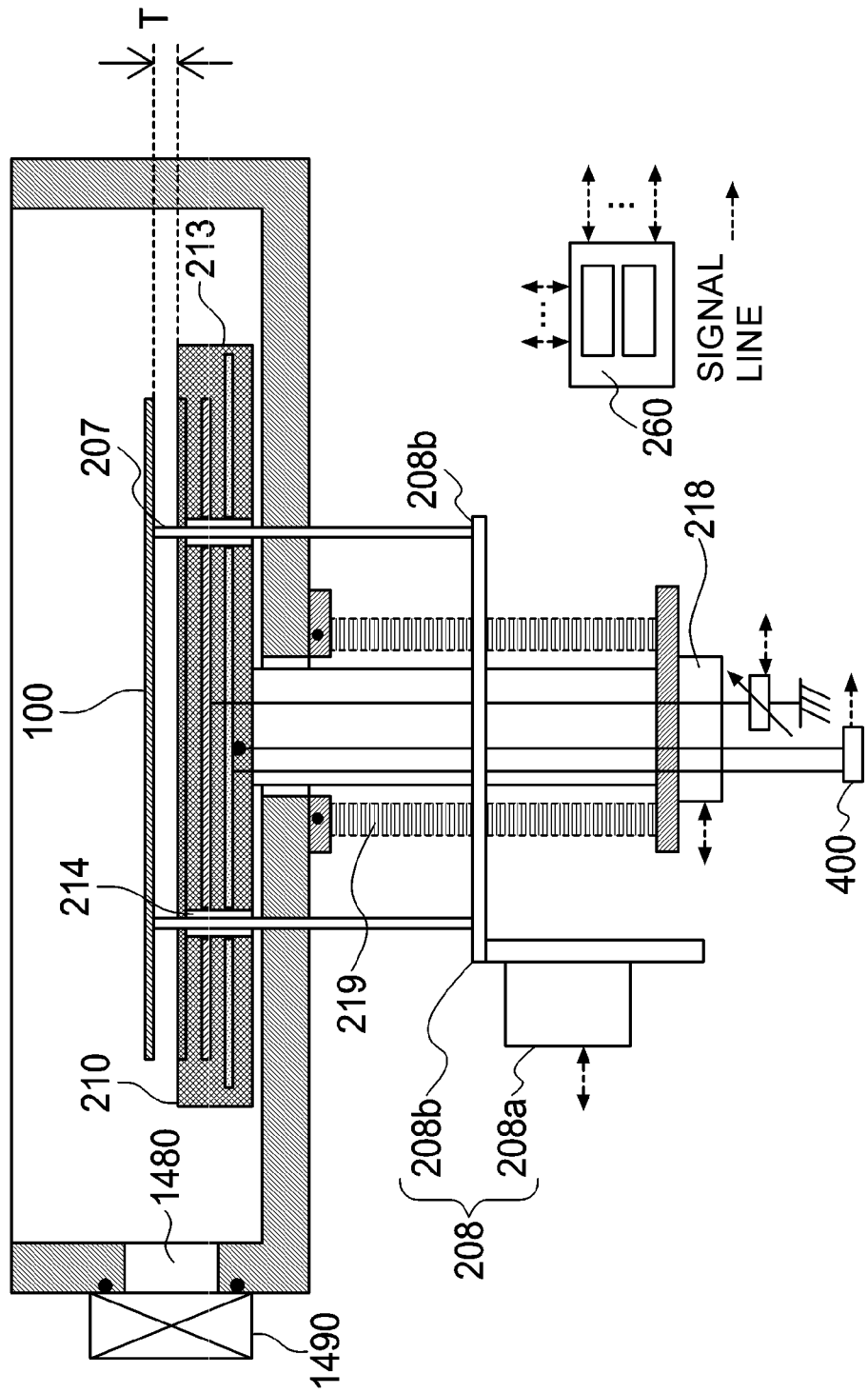
FIG. 10 schematically illustrates positional relationships among the substrate, lift pins and a substrate support of the substrate processing apparatus preferably used in the embodiments described herein.

FIG. 10 schematically illustrates a positional relationship between the substrate 100 and the substrate support 212 when the substrate 100 is transferred. As shown in FIG. 10, when the substrate 100 is transferred to and from the transfer chamber 203, the substrate support 212 is moved to the substrate transfer position. When the substrate 100 is processed, the substrate support 212 is moved to the substrate processing position (wafer processing position) as shown in FIG. 5.

Specifically, when the substrate support 212 is lowered to the substrate transfer position, upper end portions of the lift pins 207 protrude from an upper surface of the substrate placing surface 211, and the lift pins 207 support the substrate 200 from thereunder. When the substrate support 212 is elevated to the substrate processing position, the lift pins 207 are buried from the upper surface of the substrate placing surface 211 and the substrate placing surface 211 supports the substrate 200 from thereunder.

When the lift pin position adjusting part 208 is provided to elevate or lower the lift pins 207, the distance between the substrate 100 and the substrate support 212 may be adjusted by moving only the lift pins 207 while fixing the substrate support 212, or may be adjusted by moving both the lift pins 207 and the substrate support 212.

Gas Exhaust System (Gas Exhaust Mechanism)

A first exhaust port 221, which is a part of a first exhaust system (first gas exhaust mechanism) capable of exhausting an inner atmosphere of the process chamber 201, is connected to a side surface of the process chamber 201 (that is, a side surface of the upper vessel 202a). An exhaust pipe 224 is connected to the first exhaust port 221. A vacuum pump 223 and a pressure controller 227 such as an APC (Automatic Pressure Controller) configured to adjust an inner pressure of the process chamber 201 to a predetermined pressure are connected to the exhaust pipe 224 in order. The first exhaust system (first exhaust line) is mainly constituted by the first exhaust port 221, the exhaust pipe 224 and the pressure controller 227. The first exhaust system may further include the vacuum pump 223. In the present specification, the first exhaust system may be simply referred to an "exhaust system". A second exhaust port 1481 configured to exhaust an inner atmosphere of the transfer chamber 203 is connected to a side surface of the transfer chamber 203. An exhaust pipe 1482 is connected to the second exhaust port 1481. A pressure controller 228 configured to adjust an inner pressure of the transfer chamber 203 to a predetermined pressure is connected to the exhaust pipe 1482. In addition, the inner atmosphere of the process chamber 201 may be exhausted through the transfer chamber 203. The pressure controller 227 is configured to transmit and receive a pressure value (pressure data) or a valve opening degree value (valve opening degree data) to and from the controller 260 described later. The vacuum pump 223 is configured to transmit values (data) such as an ON/OFF status value (ON/OFF data) and a load value (load data) of the pump 223 to the controller 260 described later.

Gas Introduction Port

A cover 231 is provided on an upper surface (ceiling wall) of a shower head 234 provided above the process chamber 201. A gas introduction port 241 configured to supply various gases into the process chamber 201 is provided at the cover 231. A detailed configuration of each gas supply system (gas supply mechanism) connected to the gas introduction port 241 will be described later.

Gas Dispersion Mechanism

The shower head 234, which is a gas dispersion mechanism, includes a buffer chamber 232 and a dispersion plate 244a. The dispersion plate 244a may include a first electrode 244b which is a part of an activation mechanism. Holes 234a for dispersing and supplying a gas to the substrate 100 is provided at the dispersion plate 244a. The shower head 234 is provided between the gas introduction port 241 and the process chamber 201. The gas supplied through the gas introduction port 241 is supplied to the buffer chamber 232 of the shower head 234 and is then supplied to the process chamber 201 through the holes 234a. The buffer chamber 234 may also be referred as a "dispersion part".

When the dispersion plate 244a includes the first electrode 244b, the first electrode 244b may be made of a conductive metal. The first electrode 244b is a part of the activation mechanism (also referred to as "excitation mechanism" or "plasma generator") for exciting the gas. An electromagnetic wave (high frequency power or microwave) may be applied to the first electrode 244b. When the cover 231 is made of a conductive material, an insulating block 233 is provided between the cover 231 and the first electrode 244b. The insulating block 233 electrically insulates the cover 231 from the first electrode 244b.

Activation Mechanism (Plasma Generator)

The activation mechanism will be described. When the dispersion plate 244a includes the first electrode 244b, a matching mechanism 251 and a high frequency power supply 252, which are a part of the activation mechanism, are connected to the first electrode 244b. The matching mechanism 251 and the high frequency power supply 252 are configured to supply the electromagnetic wave (high frequency power or microwave) to the first electrode 244b. When the electromagnetic wave is supplied to the first electrode 244b, the gas supplied into the process chamber 201 is activated. The first electrode 244b is capable of generating capacitively coupled plasma. Specifically, the first electrode 244b may be a conductive plate supported by the upper vessel 202a. The activation mechanism is constituted by at least the first electrode 244b, the matching mechanism 251 and the high frequency power supply 252. An impedance meter 254 may be provided between the first electrode 244b and the high frequency power supply 252. The matching mechanism 251 and the high frequency power supply 252 may be feedback-controlled based on the impedance measured by the impedance meter 254. The high frequency power supply 252 may transmit or receive a power value (power data) to or from the controller 260. The matching mechanism 251 is configured to transmit and receive a matching value (matching data) including data representing traveling wave and reflected wave to or from the controller 260. The impedance meter 254 is configured to transmit and receive an impedance value (impedance data) to and from the controller 260.

Gas Supply System (Gas Supply Mechanism)

A common gas supply pipe 242 is connected to the gas introduction port 241. Various gases are supplied into the shower head 234 through the common gas supply pipe 242 and the gas introduction port 241.

Figure 6:
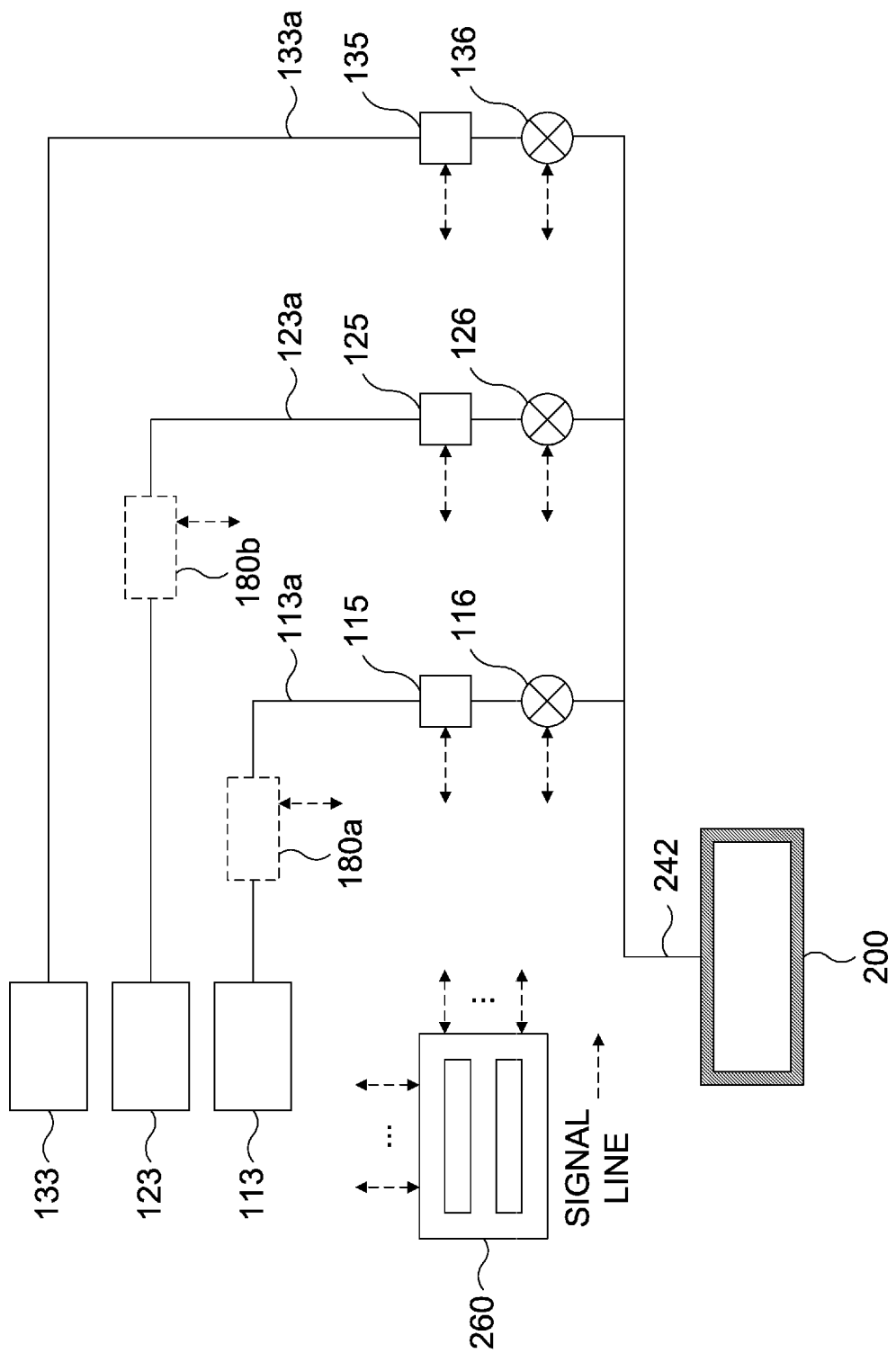
FIG. 6 schematically illustrates a gas supply system of the substrate processing apparatus preferably used in the embodiments described herein.

As shown in FIG. 6, gas supply pipes of the gas supply system are connected to the common gas supply pipe 242. Specifically, a first gas supply pipe 113a, a second gas supply pipe 123a and a third gas supply pipe 133a are connected to the common gas supply pipe 242.

A first element-containing gas (also referred to as a "first process gas" or "first gas") is mainly supplied by a first gas supply system which includes the first gas supply pipe 113a. A second element-containing gas (also referred to as a "second process gas" or "second gas") is mainly supplied by a second gas supply system which includes the second gas supply pipe 123*a*. A third element-containing gas (also referred to as "third gas") is mainly supplied by a third gas supply system which includes the third gas supply pipe 133*a*.

First Gas Supply System (First Gas Supply Mechanism)

A first gas supply source 113, a mass flow controller (MFC) 115 serving as a flow rate controller (flow rate control mechanism) and a valve 116 serving as an opening/closing valve are provided at the first gas supply pipe 113*a* in order from an upstream side to a downstream side of the first gas supply pipe 113*a*.

The first element-containing gas is supplied to the shower head 234 through the first gas supply pipe 113*a* provided with the MFC 115 and the valve 116 and the common gas supply pipe 242.

According to the embodiments, the first element-containing gas is one of process gases. The first element-containing gas may include a metal-containing gas. For example, the first element-containing gas may include a tungsten (W)-containing gas. Specifically, tungsten hexafluoride ($WF_6$) gas may be used as the first element-containing gas (tungsten-containing gas).

The first gas supply system (first gas supply mechanism) is mainly constituted by the first gas supply pipe 113*a*, the MFC 115, and the valve 116.

The first gas supply system may further include at least one of the first gas supply source 113 and a remote plasma unit (also referred to as a "remote plasma mechanism") (RPU) 180*a* for activating the first gas.

Second Gas Supply System (Second Gas Supply Mechanism)

A second gas supply source 123, a mass flow controller (MFC) 125 and a valve 126 are provided at the second gas supply pipe 123*a* in order from an upstream side to a downstream side of the second gas supply pipe 123*a*.

The second element-containing gas is supplied to the shower head 234 through the second gas supply pipe 123*a* provided with the MFC 125 and the valve 126 and the common gas supply pipe 242.

According to the embodiments, the second element-containing gas is one of the process gases. The second element-containing gas may include a hydrogen (H)-containing gas. For example, a gas such as monosilane ($SiH_4$) gas and hydrogen ($H_2$) gas may be used as the second element-containing gas (hydrogen-containing gas).

The second gas supply system (second gas supply mechanism) is mainly constituted by the second gas supply pipe 123*a*, the MFC 125, and the valve 126.

The second gas supply system may further include at least one of the second gas supply source 123 and a remote plasma unit (also referred to as a "remote plasma mechanism") (RPU) 180*b* for activating the second gas.

Third Gas Supply System (Third Gas Supply Mechanism)

A third gas supply source 133, a mass flow controller (MFC) 135 and a valve 136 are provided at the third gas supply pipe 133*a* in order from an upstream side to a downstream side of the third gas supply pipe 133*a*.

An inert gas serving as the third element-containing gas is supplied to the shower head 234 through the third gas supply pipe 133*a* provided with the MFC 135 and the valve 136 and the common gas supply pipe 242.

The inert gas is unlikely to react with the first gas. For example, a gas such as nitrogen ($N_2$) gas, argon (Ar) gas and helium (He) gas may be used as the inert gas.

The third gas supply system (third gas supply mechanism) is mainly constituted by the third gas supply pipe 133*a*, the MFC 135, and the valve 136.

According to the embodiments, the MFCs 115, 125 and 135, the valves 116, 126 and 136, a vaporizer (not shown) and the RPU 180*a* and 180*b* constituting the first gas supply system, the second gas supply system and the third gas supply system may communicate with the controller 260 to transmit and receive the data described below:

MFCs: data representing the flow rates;

Valves: data representing the opening degree of the valves;

Vaporizer: data representing the amount of vaporization; and

RPU: data representing the amount of electrical power.

Controller

Figure 5:
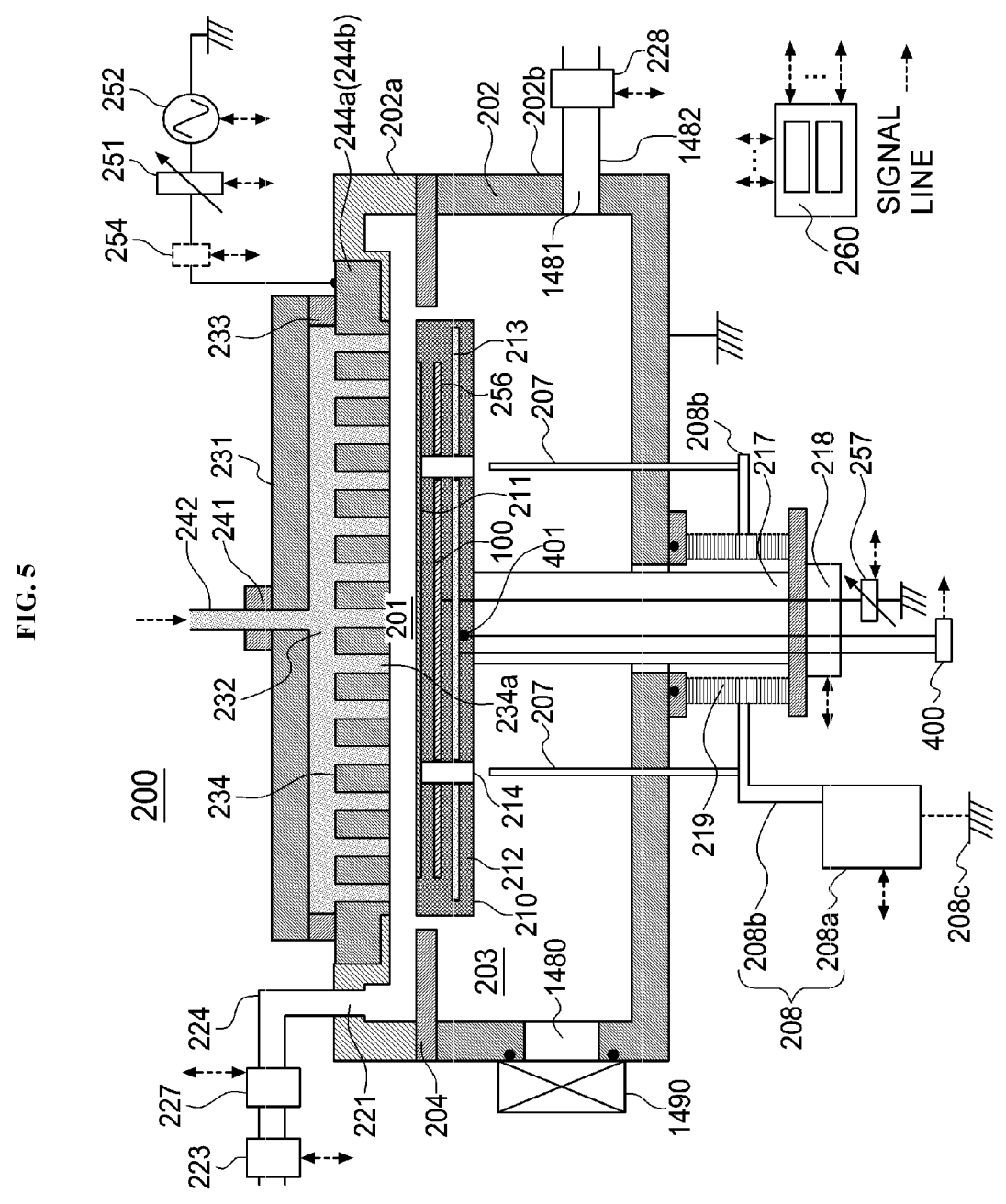

As shown in FIG. 5, the substrate processing apparatus 200 includes the controller 260 configured to control the operations of components of the substrate processing apparatus 200.

Figure 7:
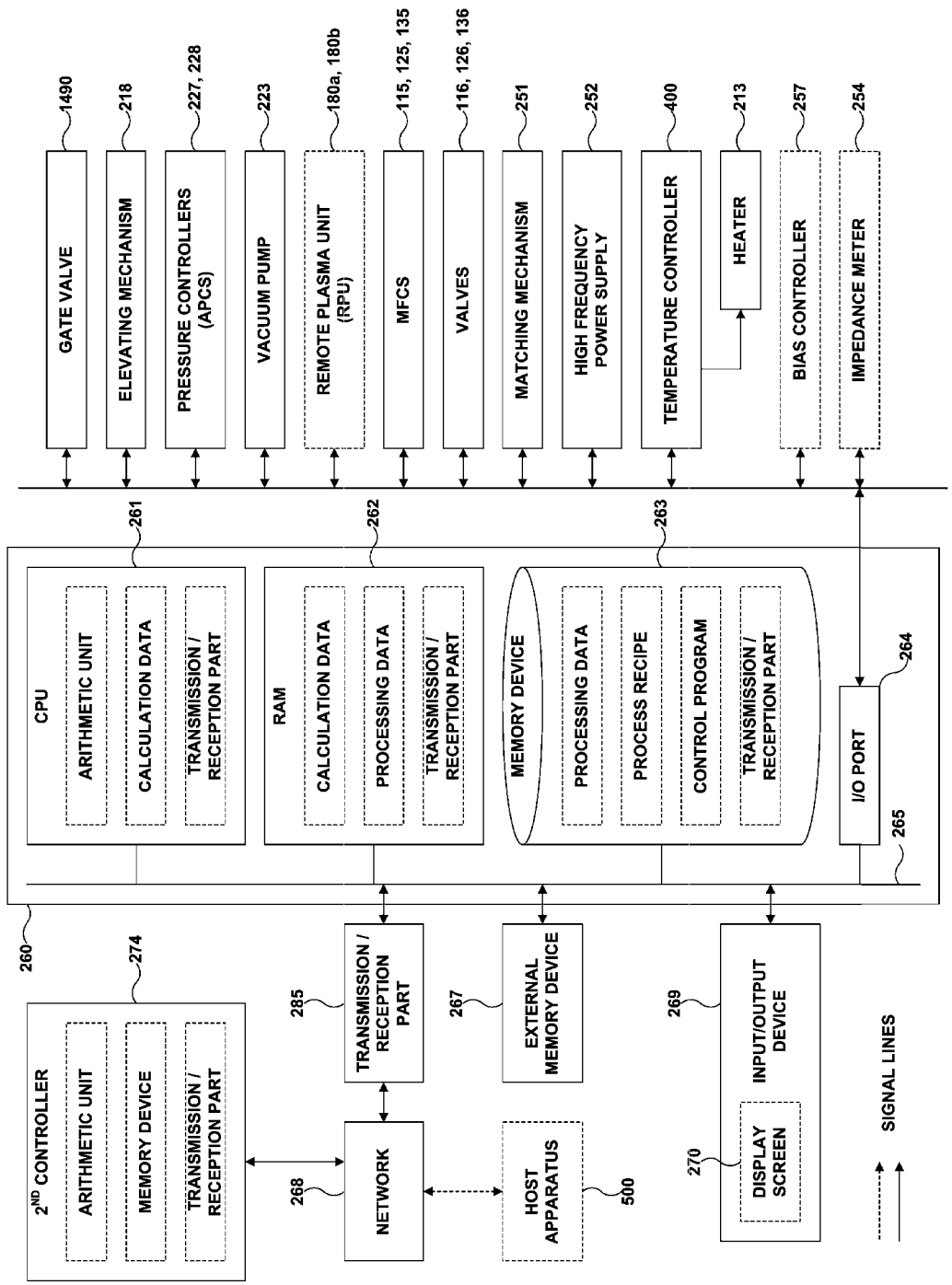
FIG. 7 is a block diagram schematically illustrating a configuration of a controller of the substrate processing apparatus preferably used in the embodiments described herein.

FIG. 7 is a block diagram schematically illustrating a configuration of the controller 260 and components connected to the controller 260 such as a second controller 274, a network 268 and a host apparatus 500. The controller 260, which is a control device, may be embodied by a computer having a CPU (Central Processing Unit) 261, a RAM (Random Access Memory) 262, a memory device 263 and an I/O port 264. The RAM 262, the memory device 263 and the I/O port 264 may exchange data with the CPU 261 via an internal bus 265. An input/output device 269 such as a touch panel, an external memory device 267 and a transmission/reception part 285 may be connected to the controller 260. The input/output device 269 may further include a display screen 270 configured to display the status of the substrate processing apparatus 200 and the data received from the second controller 274. The display screen 270 serves as a notifying part or a display part.

The memory device 263 may be embodied by components such as flash memory and HDD (Hard Disk Drive). A control program for controlling the operation of the substrate processing apparatus 200; a process recipe in which information such as the sequences and conditions of the substrate processing is stored; and calculation data and processing data generated in the process of setting the process recipe used for processing the substrate 100 are readably stored in the memory device 263. The process recipe is a program that is executed by the controller 260 to obtain a predetermined result by performing sequences of processes. Hereinafter, the process recipe and the control program may be collectively referred to simply as "program". In the present specification, the term "program" may refer to only the process recipe, only the control program, or both. The RAM 262 functions as a work area in which the program or the data such as the calculation data and the processing data read by the CPU 261 are temporarily stored.

The I/O port 264 is electrically connected to the components such as the gate valve 1490, the elevating mechanism 218, the temperature controller 400, the pressure controllers 227 and 228, the vacuum pump 223, the matching mechanism 251, the high frequency power supply 252, the MFCs 115, 125 and 135, the valves 116, 126 and 136, the driving part 208*a* and the bias controller 257. The I/O port 264 may be electrically connected to the components such as the impedance meter 254, the RPUs 180*a* and 180*b*, a vacuum transfer robot 2700 described later and an atmospheric transfer robot 2220 described later. In the present specification, "electrically connected" means that the components are connected by electrical cables or the components are in communication with one another to transmit and receive signals (electronic data) to and from one another directly or indirectly.

The CPU 261, which is an arithmetic unit, is configured to read and execute the control program stored in the memory device 263, and read the process recipe stored in the memory device 263 in accordance with an instruction such as an operation command inputted via the input/output device 269. The CPU 261 is capable of computing the calculation data by comparing a value inputted from the transmission/reception part 285 with the process recipe or control data stored in the memory device 263. The CPU 261 may select the process recipe or the processing data based on the calculation data. The CPU 261 may be configured to control operation of the substrate processing apparatus 200 according to the process recipe. For example, the CPU 261 may be configured to control operations, according to the process recipe, such as an opening/closing operation of the gate valve 1490, an elevating/lowering operation of the elevating mechanism 218, an elevating/lowering operation of the driving part 208a, an operation of supplying electrical power to the temperature controller 400, an operation of adjusting the temperature of the substrate support 212 by the temperature controller 400, pressure adjusting operations of the pressure controllers 227 and 228, an ON/OFF control of the vacuum pump 223, gas flow rate adjusting operations of the MFCs 115, 125 and 135, gas activation operations of the RPUs 180a and 180b, opening/closing operations of the valves 116, 126 and 136, a matching operation of the power of the matching mechanism 251, an operation of controlling the power of the high frequency power supply 252, a control operation of the bias controller 257, and a matching operation of the matching mechanism 251 based on the data measured by the impedance meter 254. A transmission/reception part of the CPU 261 may transmit or receive control information according to the process recipe to or from the components described above to control the operations of the components.

The controller 260 is not limited to a dedicated computer. The controller 260 may be embodied by a general-purpose computer. The controller 260 according to the embodiments may be embodied by preparing the external memory device 267 (e.g., a magnetic tape, a magnetic disk such as a flexible disk and a hard disk, an optical disk such as a CD and a DVD, a magneto-optical disk such as MO, a semiconductor memory such as a USB memory and a memory card), and installing the program onto the general-purpose computer using the external memory device 267. The method of providing the program to the computer is not limited to the external memory device 267. The program may be directly provided to the computer by a communication means such as the transmission/reception part 285 and the network 268 (Internet and a dedicated line) instead of the external memory device 267. The memory device 263 and the external memory device 267 may be embodied by a computer-readable recording medium. Hereafter, the memory device 263 and the external memory device 267 are collectively referred to as recording media. In the present specification, the term "recording media" may refer to only the memory device 263, only the external memory device 267, or both.

(2) Substrate Processing

Hereinafter, the substrate processing according to embodiments of the technique will be described with reference to FIGS. 8, 9, 10, 12 and 14. The substrate processing is performed as one of manufacturing processes of a semiconductor device. For example, the substrate processing includes: heating the substrate 100 by changing the temperature elevating rate of the substrate 100 by setting the apparatus parameters of the components of the substrate processing apparatus 200 based on the substrate data described above; and cooling the substrate by changing the temperature lowering rate of the substrate 100 based on the substrate data after forming a film on the substrate 100.

Parameter Setting Process

Figure 8:
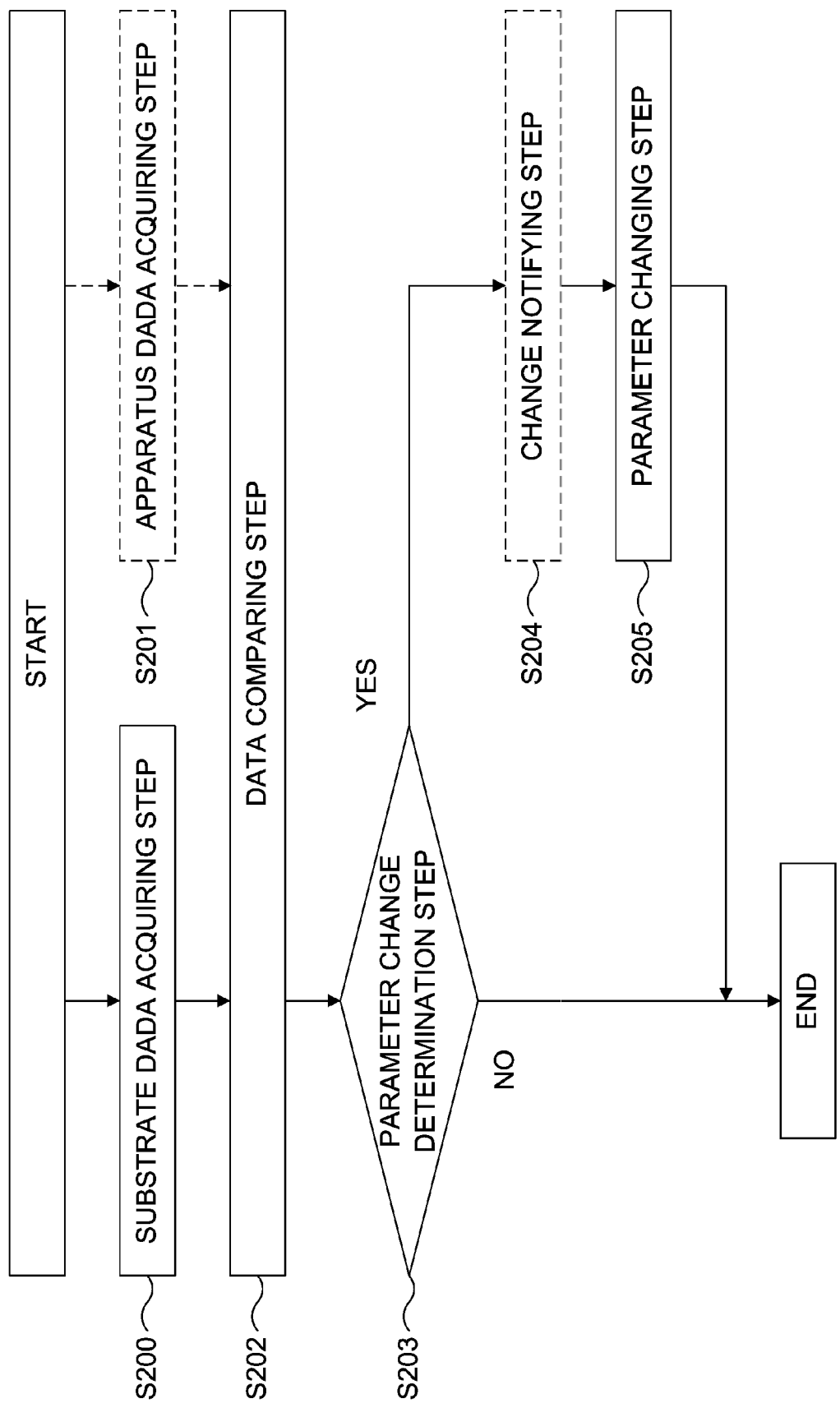
FIG. 8 is a flowchart schematically illustrating a parameter setting process according to the embodiments described herein.

First, a parameter setting process of setting the apparatus parameters of the components of the substrate processing apparatus 200 will be described with reference to FIG. 8. The parameter setting process includes a substrate data acquiring step S200, a data comparing step S202 and a parameter change determination step S203. Depending on the determination result of the parameter change determination step S203, the parameter setting process is ended without changing the apparatus parameters or the parameter setting process is ended by performing a parameter changing step S205.

Substrate Data Acquiring Step S200

First, the substrate data acquiring step S200 of acquiring the substrate data associated with the substrate 100 processed by the substrate processing apparatus 200 is performed. In the present specification, the term "substrate data" may refer to data such as data representing the state of the substrate 100, product name data of a device (semiconductor device) formed on the substrate 100, process name data or step name data performed by the substrate processing apparatus 200, the number of layers formed on the substrate 100, and a structure of the device formed on the substrate 100. For example, the substrate data is acquired by receiving the substrate data transmitted from the host apparatus 500, the second controller 274 or other substrate processing apparatuses 200 via the network 268. The substrate data may be acquired from the data input through the input/output device 269 by an operator operating the substrate processing apparatus 200. Apparatus parameter data corresponding to the substrate data acquired in the substrate data acquiring step S200 is stored in a field such as "FIRST PRESET VALUE", "SECOND PRESET VALUE", "THIRD PRESET VALUE", "FOURTH PRESET VALUE" and "FIFTH PRESET VALUE" of an apparatus parameter table shown in FIG. 11 according to the contents of the substrate data such as the number of layers.

Apparatus Data Acquiring Step S201

Before the data comparing step S202 is performed, the apparatus data acquiring step S201 may be performed. In the apparatus data acquiring step S201, current state parameter data of the components provided in the substrate processing apparatus 200 is acquired. The current state parameter data may be read from the components, respectively. Alternatively, the current state parameter data may be read from data recorded in the RAM 262 or the memory device 263. The read data (that is, the current state parameter data) is stored in a "CURRENT STATE" field of the apparatus parameter table shown in FIG. 11.

Data Comparing Step S202

Figure 11:
FIG. 11 schematically illustrates an exemplary apparatus parameter table according to the embodiments described herein.

In the data comparing step S202, the apparatus parameter data corresponding to the substrate data shown in FIG. 11 is compared with the current state parameter data by the CPU 261.

Parameter Change Determination Step S203

After the apparatus parameter data and the current state parameter data are compared in the data comparing step S202, the parameter change determination step S203 is performed. When it is determined that there is no difference between the apparatus parameter data and the current state parameter data as a result of the comparison in the data comparing step S202 ("NO" in FIG. 8), the parameter setting process is ended without changing the current state parameter data. When it is determined that the apparatus parameter data is different from the current state parameter data as a result of the comparison in the data comparing step S202 ("YES" in FIG. 8), the parameter changing step S205 is performed. A change notifying step S204 may be performed before the parameter changing step S205 is performed.

Change Notifying Step S204

In the change notifying step S204, it is notified that the change is necessary with respect to the parameters of the components of the substrate processing apparatus 200. Specifically, the change notifying step S204 is performed by transmitting a message (data) indicating that the change is necessary to at least one of the display screen 270, the second controller 274 and the host apparatus 500.

Parameter Changing Step S205

In the parameter changing step S205, the apparatus parameters of the components of the substrate processing apparatus 200 is updated with the apparatus parameter data corresponding to the substrate data received in the substrate data acquiring step S200. That is, the apparatus parameter data corresponding to the substrate data is set as new apparatus parameters of the components of the substrate processing apparatus 200.

In the manner described above, the apparatus parameters of the components of the substrate processing apparatus 200 are set. The apparatus parameters for changing the temperature elevating rate may be set differently between a first temperature elevating step S302a and a second temperature elevating step S302b, which are described later.

Subsequently, the apparatus parameters of the components of the substrate processing apparatus 200 set in the first temperature elevating step S302a and the substrate data will be described with reference to FIG. 11. As shown in FIG. 11, the substrate data is data relating to a multilayer structured film (that is, the film formed in the multilayer structure) on the substrate 100, for example. Specifically, the substrate data is related to at least one of the number of layers of the film, the structure of the film, and the process recipe. The apparatus parameters corresponding to the substrate data, for example, preset values shown in FIG. 11, are stored in the memory device 263 of the substrate processing apparatus 100. In the embodiments, for example, preset values such as first preset value, second preset value, third preset value, fourth preset value and fifth preset value are stored. For example, when the temperature elevating rate of the substrate 100 is high, problems such as the distortion of the film formed on the substrate 100 and the distortion of the substrate 100 may occur. The problems such as the distortions become conspicuous as the number of layers of the multilayer structured film increases. FIG. 11 illustrates an example in which the temperature elevating rate is changed according to the substrate data when the number of layers is used as the substrate data. For example, the preset values shown in FIG. 11 are set such that the temperature elevating rate increases to the left side of FIG. 11 and decreases to the right side of FIG. 11. For example, as shown in FIG. 11, the apparatus parameters that influence the temperature elevating rate include parameters such as a holding height T of the substrate 100, a holding time on the lift pins, a transfer time of the substrate 100, the flow rate of the inert gas, the pressure of the process chamber and a type of the inert gas. The holding height T refers to the distance between the substrate 100 and the surface of the substrate support part 210, as shown in FIG. 10. As the holding height T increases, the temperature elevating rate decreases, and as the holding height T decreases, the temperature elevating rate increases. The holding time on the lift pins refers to the time to hold the substrate 100 on the lift pins 207, as shown in FIG. 10. The transfer time refers to the time required to transfer the substrate 100 from the lift pins 207 to the substrate support part 210. As the transfer time is lengthened, the temperature elevating rate decreases, and as the transfer time is shortened, the temperature elevating rate increases. The holding time on the lift pins and the transfer time may be referred to collectively or separately as a time during which the substrate 100 is separated from the surface of the substrate support 212.

Figure 12:
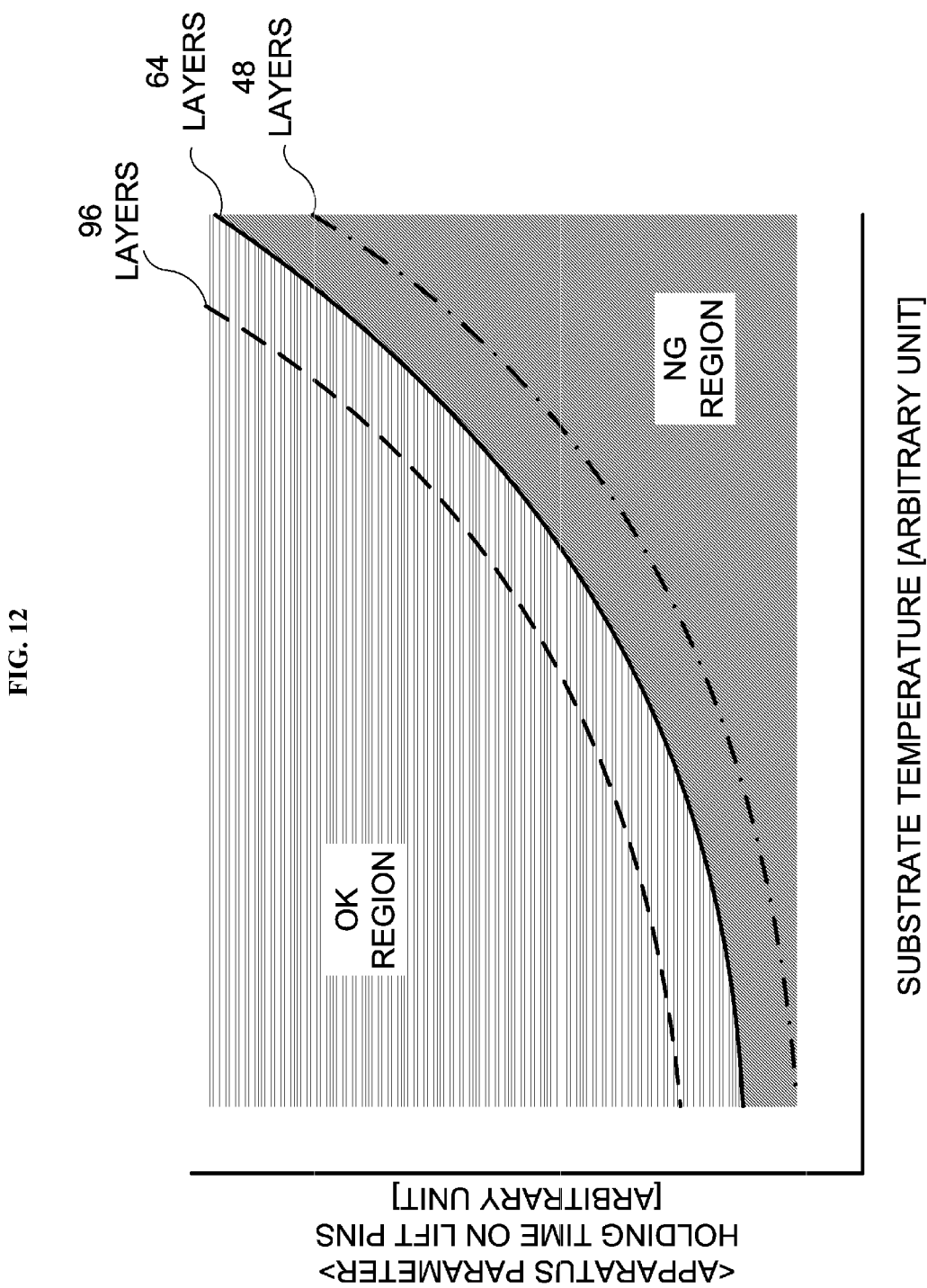
FIG. 12 schematically illustrates an exemplary relationship between an apparatus parameter and a temperature of the substrate according to the embodiments.
Figure 13:
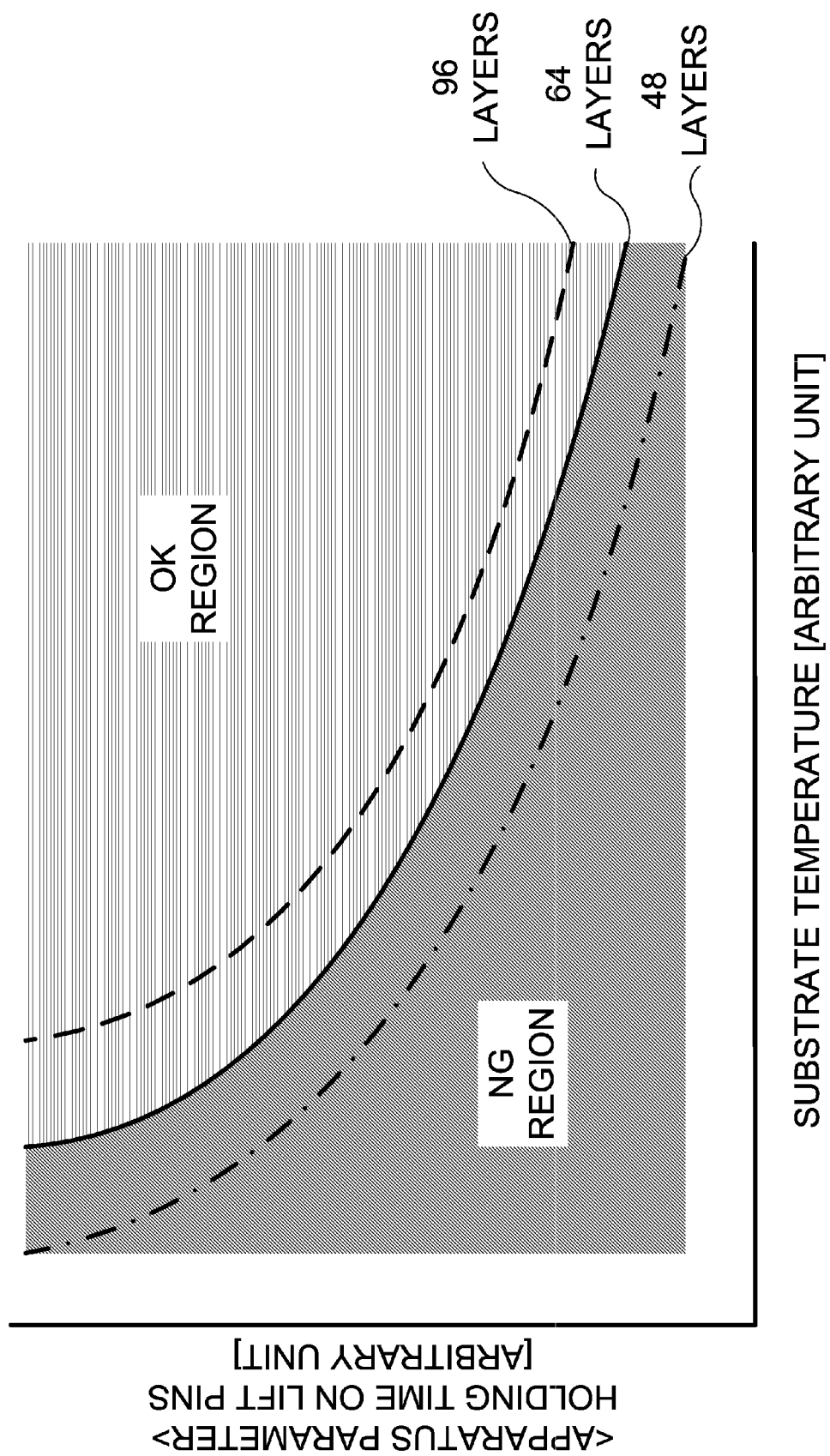
FIG. 13 schematically illustrates another exemplary relationship between the apparatus parameter and the temperature of the substrate according to the embodiments.

A relationship between the temperature of the substrate and the apparatus parameters such as the holding time on the lift pins is shown in FIG. 12 when the temperature elevating rate is indirectly regarded as the substrate temperature. FIG. 12 schematically illustrates an exemplary relationship between the temperature of the substrate and the holding time on the lift pins. A region in which no defect occurs in the substrate 100 ("OK REGION" in FIG. 12) and a region in which a defect occurs in the substrate 100 ("NG REGION" in FIG. 12) are shown in FIG. 12. In FIG. 12, a solid line indicates the relationship when the number of layers formed on the substrate 100 is 64. The solid line also serves as a reference of the "OK REGION" and "NG REGION". When the number of layers formed on the substrate 100 is increased to 96 layers, the "NG REGION" is shifted to a dashed line indicating the relationship when the number of layers formed on the substrate 100 is 96. On the contrary, when the number of layers formed on the substrate 100 is decreased to 48 layers, the "OK REGION" is shifted to a dot-and-dash line indicating the relationship when the number of layers formed on the substrate 100 is 48. As shown in FIG. 12, as the number of layers increases, the "OK REGION" narrows. Therefore, when the temperature of the substrate is changed, it is necessary to change the apparatus parameters. In FIG. 12, the temperature of the substrate is assumed to be a medium temperature to high temperature range of about 300° C. to 800° C. In a low temperature range from room temperature to about 300° C., the curve (characteristic) indicating the relationship is changed as shown in FIG. 13 since the main factor of heat conduction to the substrate 100 changes depending on the temperature range. In the medium temperature to high temperature range, a front surface and a back surface of the substrate 100 are heated relatively uniformly since the substrate 100 is heated by many factors such as the radiant heat and the heating via the gas present in the process chamber 201 in addition to the heat conduction. However, in the low temperature range, the effect of the radiant heat and the heating via the gas present in the process chamber 201 is reduced, and the main factor is the heat conduction from the substrate 100. Therefore, in the low temperature range, a heat distribution is generated on the substrate 100 and the distortion tends to occur in the film formed on the substrate 100. Thus, the curve (characteristic) is changed as shown in FIG. 13 in the low temperature range. In addition, the curve indicating the relationship in the low temperature range shown in FIG. 13 is bilaterally symmetrical with the curve shown in FIG. 12. Thus, in the low temperature range, the apparatus parameters of the components of the substrate processing apparatus 200 may be set using the apparatus parameter table shown in FIG. 11 in a reverse manner. For example, when increasing the temperature elevating rate in the low temperature range, the apparatus parameters may be set a value close to the fifth preset value shown in the right side of FIG. 11.

Figure 14:
FIG. 14 schematically illustrates another exemplary apparatus parameter table according to the embodiments described herein.

Subsequently, the apparatus parameters of the components of the substrate processing apparatus 200 set in the second temperature elevating step S302b and the substrate data will be described with reference to FIG. 14. As shown in FIG. 14, the apparatus parameters that can be changed in the second temperature elevating step S302b mainly includes parameters such as the flow rate of the inert gas, the pressure of the process chamber and the type of the inert gas. The apparatus parameters of the second temperature elevating step S302b may be set to be the same as those of the first temperature elevating step S302a. However, the apparatus parameters of the second temperature elevating step S302b may be different from those of the first temperature elevating step S302a. For example, when the fourth preset value is selected as the apparatus parameters of the first temperature elevating step S302a, the fourth preset value of the second temperature elevating step S302b may be set to be larger than the fourth preset value of the first temperature elevating step S302a. By setting the apparatus parameters of the second temperature elevating step S302b in a manner described above, the temperature elevating rate of the second temperature elevating step S302b can be made higher than that of the first temperature elevating step S302a to shorten a temperature elevating time in the second temperature elevating step S302b. Further, by setting the fifth preset value as the apparatus parameters of the second temperature elevating step S302b, the temperature elevating rate of the second temperature elevating step S302b may be configured to be lower than that of the temperature elevating step S302a. By setting the apparatus parameters of the second temperature elevating step S302b as described above, it is possible to suppress the distortion of the film formed on the substrate 100 or the distortion of the substrate 100.

In addition, the temperature elevating rates of the first and second temperature elevating steps S302a and S302b, that is, the apparatus parameters of the first and second temperature elevating steps S302a and S302b, are set such that the difference between the temperature of the front surface of the substrate 100 and the temperature of the back surface of the substrate 100 becomes a predetermined temperature. For example, the temperature elevating rate of the first temperature elevating step S302 is controlled based on the substrate data such that the difference between the temperature of the front surface of the substrate 100 and the temperature of the back surface of the substrate 100 is within a predetermined range.

Substrate Processing

Figure 9:
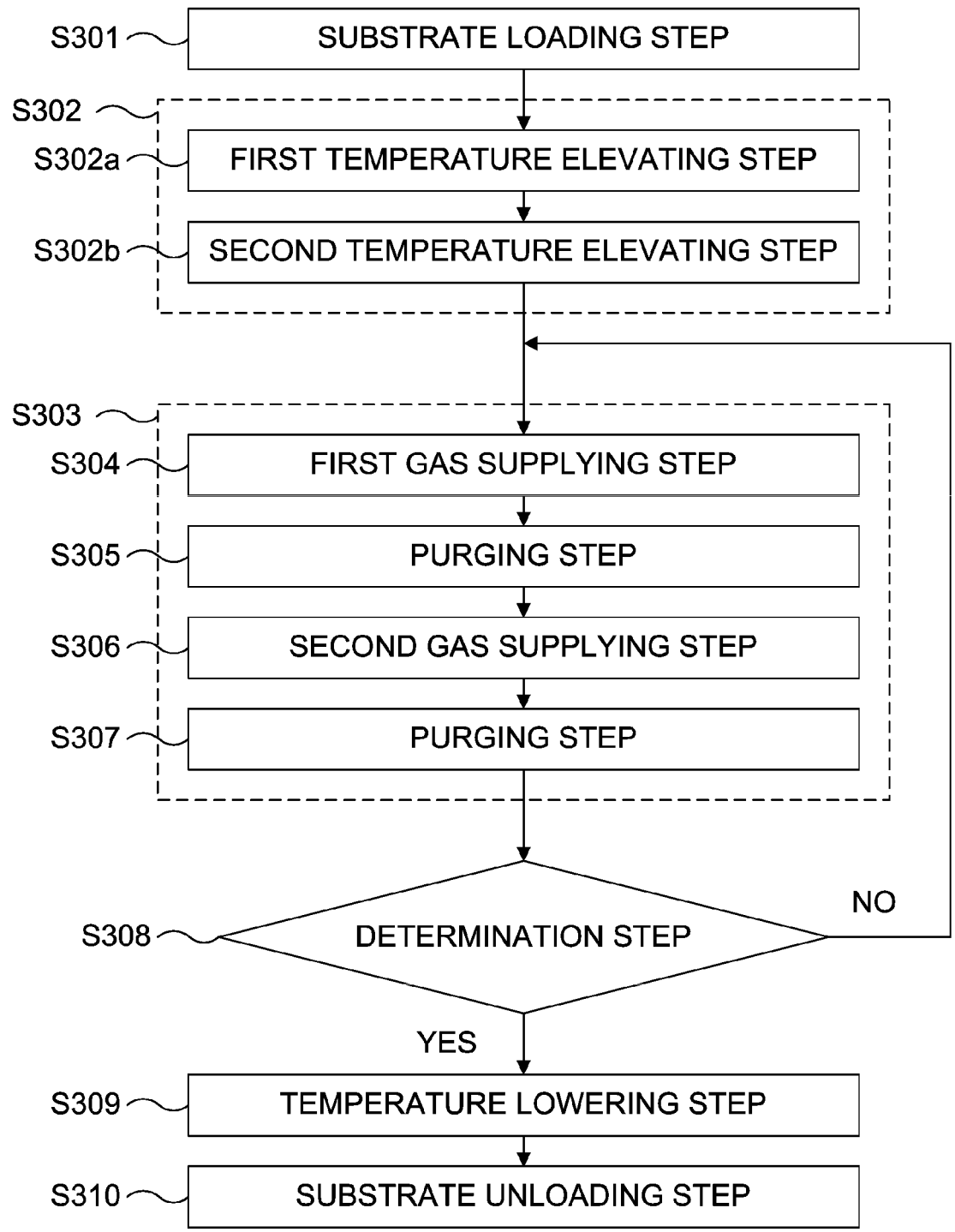
FIG. 9 is a flowchart schematically illustrating a substrate processing according to the embodiments described herein.

Hereinafter, the substrate processing will be described with reference to FIG. 9.

Substrate Loading Step S301

In the substrate processing, first, the substrate 100 is loaded into the process chamber 201. Specifically, the substrate support part 210 is lowered by the elevating mechanism 218 until the lift pins 207 protrude from the upper surface of the substrate support part 210 through the holes 214 as shown in FIG. 10, for example. After the inner pressure of the process chamber 201 or the inner pressure of the transfer chamber 203 is adjusted to a predetermined pressure, the gate valve 1490 is opened. The substrate 100 is then transferred through the gate valve 1490 and placed on the lift pins 207. After the substrate 100 is placed on the lift pins 207, the gate valve 1490 is then closed. By elevating the substrate support part 210 to a predetermined position by the elevating mechanism 218, the substrate 100 is transferred from the lift pins 207 to the substrate support part 210. Next, the process chamber 201 may be exhausted via the exhaust pipe 224, the exhaust pipe 1482 or both of the exhaust pipe 224 and the exhaust pipe 1482 until the inner pressure of the process chamber 201 reaches a predetermined level (vacuum level). In the substrate loading step S301, the opening degree of the pressure controller 227, the opening degree of the pressure controller 228 or both may be feedback-controlled based on the pressure measured by a pressure sensor (not shown).

Temperature Elevating Step S302

The temperature elevating step S302 is performed to elevate the temperature of the substrate 100. The temperature elevating step S302 at least include two steps, that is, the first temperature elevating step S302a and the second temperature elevating step S302b. After the first temperature elevating step S302a is performed, the second temperature elevating step S302b is performed.

First Temperature Elevating Step S302a

The first temperature elevating step S302a is performed while the substrate 100 is supported by the lift pins 207 and is separated from the substrate support part 210. The first temperature elevating step S302a is performed after the apparatus parameters are changed based on the substrate data as described above, that is, the temperature elevating rate is changed based on the substrate data. After the temperature of the substrate 100 is elevated to a predetermined temperature or after a predetermined time elapses, the lift pins 207 are lowered or the substrate support part 210 is elevated. By lowering the lift pins 207 or elevating the substrate support part 210, the substrate 100 is transferred from the lift pins 207 to the substrate support part 210. Then, the second temperature elevating step S302b is started.

Second Temperature Elevating Step S302b

In the second temperature elevating step S302b, the substrate 100 is supported by substrate support part 210 for a predetermined time. After the substrate 100 is supported by substrate support part 210 for the predetermined time or after the predetermined time elapses, a film-forming process S303 is performed. By elevating the temperature of the substrate 100 by changing the temperature elevating rate of the substrate 100 as described above, it is possible to elevate the temperature of the substrate 100 while suppressing the distortion of the structure formed on the substrate 100 or the distortion of the substrate even when the substrate 100 includes the multilayer structure.

In the second temperature elevating step S302b, the temperature of the heater 213 is set to a constant temperature within a range from 100° C. to 700° C., preferably from 300° C. to 500° C. The temperature of the heater 213 is controlled such that the temperature of the substrate 100 is maintained at a predetermined temperature during at least the film-forming process S303. Specifically, the power supplied to the heater 213 is feedback-controlled based on the temperature detected by the temperature sensor 401 to maintain the substrate support part 210 at the predetermined temperature.

Film-Forming Process S303

The film-forming process S303 includes a first gas supplying step S304, a purging step S305, a second gas supplying step S306 and a purging step S307, which will be described later. While the film-forming process S303 will be described by way of an example wherein the first gas supplying step S304, the purging step S305, the second gas supplying step S306 and the purging step S307 are performed sequentially, the first gas supplying step S304 and the second gas supplying step S306 may be performed in a partially simultaneous manner. When the first gas supplying step S304 and the second gas supplying step S306 are performed in a partially simultaneous manner, the purging step S305 and the purging step S307 may be performed simultaneously or one of the purging step S305 and the purging step S307 may be omitted.

First Gas Supplying Step S304

In the first gas supplying step S304, $WF_6$ gas serving as the first gas (the first process gas) is supplied into the process chamber 201 by the first gas supply system. Specifically, the flow rate of the $WF_6$ gas supplied from the first gas supply source 113 is adjusted by the MFC 115. The $WF_6$ gas whose flow rate is adjusted is supplied to the substrate processing apparatus 200, then passes through the buffer chamber 232 and is supplied into the depressurized process chamber 201 via the buffer chamber 232 and the holes 234a of the shower head 234. The exhaust system continuously exhausts the process chamber 201 such that the inner pressure of the process chamber 201 is maintained at a predetermined pressure. With the inner pressure of the process chamber 201 is maintained at the predetermined pressure, the $WF_6$ gas is supplied to the substrate 100 in the process chamber 201 at a first pressure preferably ranging from 10 Pa to 1,000 Pa. By supplying the $WF_6$ gas, a tungsten-containing layer is formed on the substrate 100.

Purging Step S305

After the tungsten-containing layer is formed on the substrate 100, the valve 116 is closed to stop the supply of the $WF_6$ gas. The purging step S305 is performed by stopping the supply of the $WF_6$ gas (first gas) and exhausting the first gas present in the process chamber 201 or the process gas (first gas) present in the buffer chamber 232 by the first exhaust system.

In the purging step S305, the remaining gas in the process chamber 201 may be extruded by further supplying the inert gas from the inert gas supply source 133 in addition to vacuum-exhausting the gas. In order to supply the inert gas, the valve 136 is opened and the flow rate of the inert gas is adjusted by the MFC 135. The vacuum exhaust may be combined with the supply of the inert gas. Alternatively, the vacuum exhaust and the supply of the inert gas may be alternately performed.

After a predetermined time elapses, the supply of the inert gas is stopped by closing the valve 136. However, the inert gas may be continuously supplied by maintaining the valve 136 open.

Second Gas Supplying Step S306

After the purging step S305 is performed, $SiH_4$ gas serving as the second gas (also referred to as the second process gas or a reactive gas) is supplied into the process chamber 201 by the second gas supply system. Specifically, the valve 126 is opened and the $SiH_4$ gas is supplied into the process chamber 201 via the gas introduction port 241, the buffer chamber 232 and the holes 234a.

In the second gas supplying step S306, the flow rate of the $SiH_4$ gas is adjusted by the MFC 125 to a predetermined flow rate. For example, the flow rate of the $SiH_4$ gas may range from 1 sccm to 10,000 sccm.

As the $SiH_4$ gas is supplied to the tungsten-containing layer formed on the substrate 100, the tungsten-containing layer is modified into a tungsten (W) layer having a predetermined thickness. Specifically, the tungsten layer is formed on the substrate 100 by reducing fluorine (F) contained in the tungsten-containing layer.

Purging Step S307

The purging step S307 substantially the same as the purging step S305 is performed. For example, the supply of the second gas is stopped and the second gas present in the process chamber 201 or the second gas present in the buffer chamber 232 is exhausted by the exhaust system. The purging step S307 may be performed by supplying the purge gas into the buffer chamber 232 and the process chamber 201.

Determination Step S308

After the purging step S307 is completed, the controller 260 determines whether a cycle (the film-forming process S303) including the steps S304 through S307 is performed a predetermined number of times (n times). That is, the controller 260 determines that whether the tungsten layer formed on the substrate 100 has a desired thickness. A tungsten film having a predetermined thickness may be formed on the substrate 100 by performing the cycle including the steps S304 through S307 at least once.

When the controller 260 determines, in the determination step S308, that the cycle is not performed the predetermined number of times ("NO" in FIG. 9), the film-forming process S303 is performed again. When the controller 260 determines, in the determination step S308, that the cycle is performed the predetermined number of times ("YES" in FIG. 9), the film-forming process S303 is terminated and a temperature lowering step S309 is then performed.

Temperature Lowering Step S309

After the determination step S308, in the temperature lowering step S309, the apparatus parameters corresponding to the temperature lowering rate (cooling rate) of the substrate 100 are set based on the substrate data, the integrated time data of the film-forming process S303 or both. For example, when the number of layers formed on the substrate 100 is large, the apparatus parameters are set based on the substrate data such that the temperature lowering rate may be lowered.

Since a relationship between the apparatus parameters corresponding to the temperature lowering rate and the substrate data is similar to the relationship between the apparatus parameters corresponding to the temperature elevating rate and the substrate data, a detailed description of the relationship between the apparatus parameters corresponding to the temperature lowering rate and the substrate data will be omitted.

By lowering the temperature of the substrate 100 based on the apparatus parameters as described above, it is possible to suppress the distortion of the substrate 100 while the temperature of the substrate 100 is lowered.

Since the temperature lowering step S309 is performed in a manner reverse to the temperature elevating step S302 described above, a detailed description of the temperature lowering step S309 will be omitted.

Figure 15:
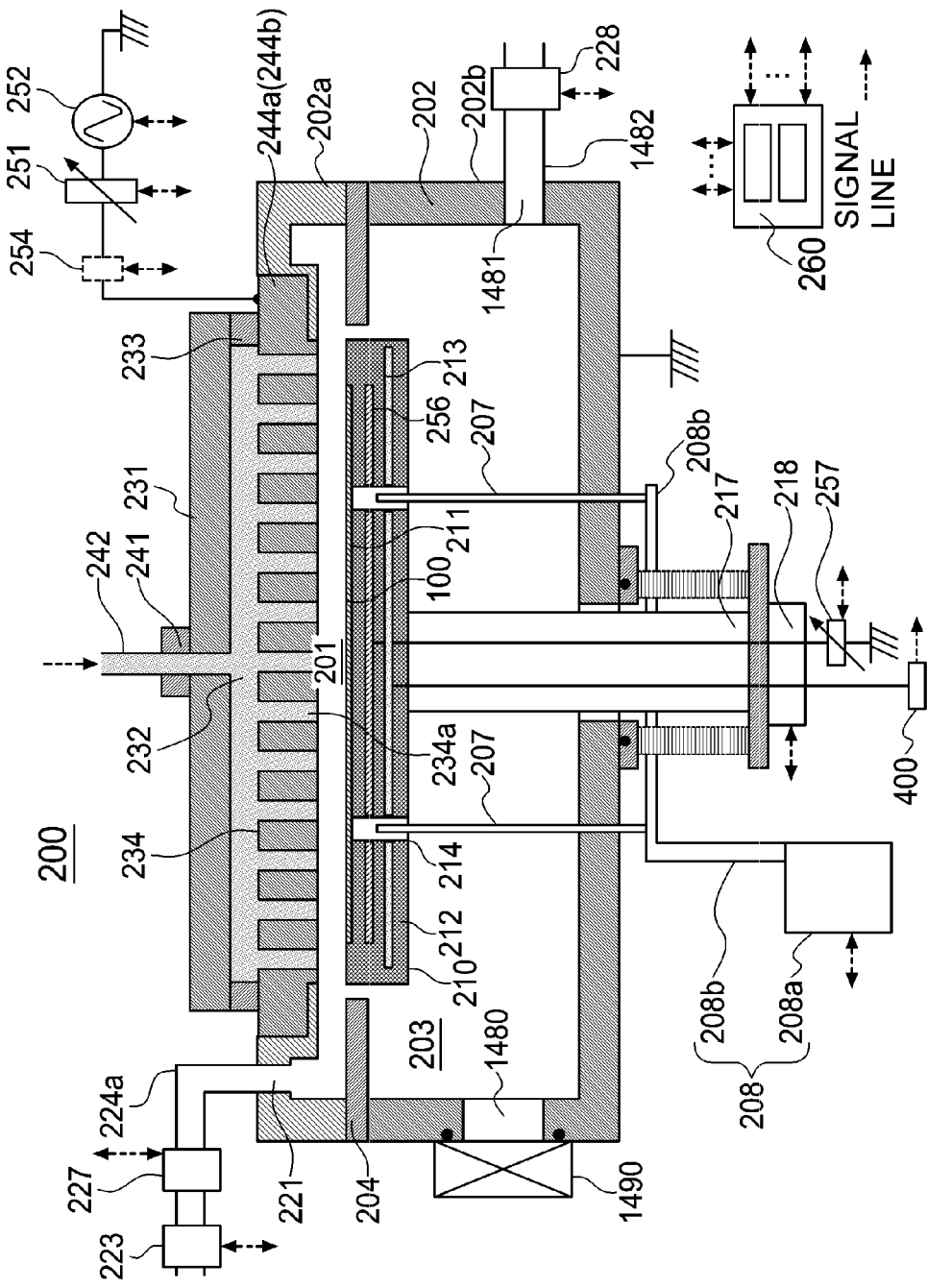
FIG. 15 schematically illustrates another vertical cross-section of the substrate processing apparatus preferably used in the embodiments described herein.

In addition, before placing the substrate 100 on the lift pins 207, as shown in FIG. 15, the lift pins 207 may be inserted into the through-holes 214 of the substrate support part 210 to heat front ends of the lift pins 207 in advance. By heating the lift pins 207 in advance as described above, it is possible to suppress the substrate 100 from being distorted when the substrate 100 is placed on the lift pins 207 from the substrate support part 210.

Substrate Unloading Step S310

After the substrate 100 is cooled to a predetermined temperature in the temperature lowering step S309, the gate valve 1490 is opened and the substrate 100 is unloaded from the transfer chamber 203 to the vacuum transfer chamber 2400.

In the manner described above, the substrate processing of the embodiments is performed.

OTHER EMBODIMENTS

While the technique is described in detail by way of the embodiments, the above-described technique is not limited thereto. The above-described technique may be modified in various ways without departing from the gist thereof.

Figure 16:
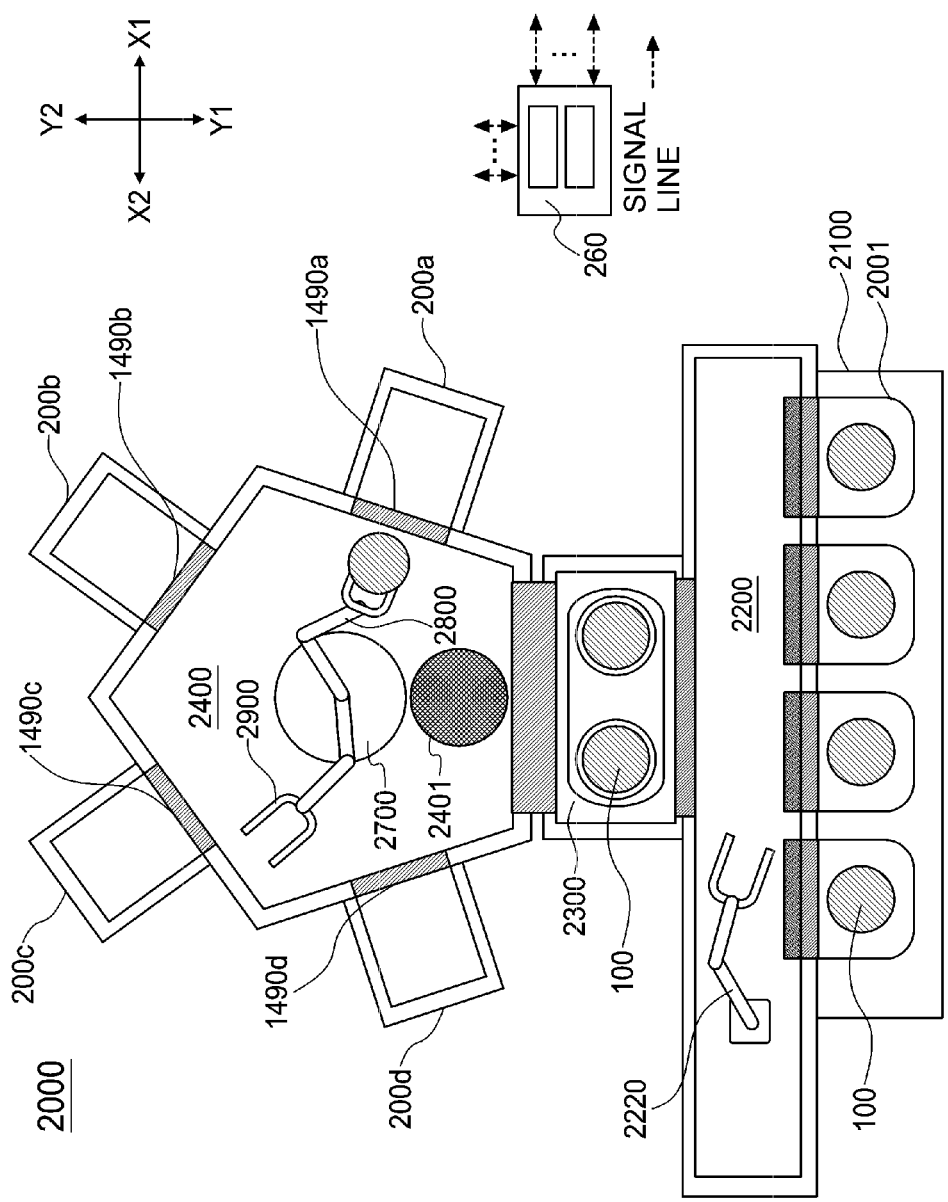
FIG. 16 schematically illustrates a substrate processing system preferably used in the embodiments described herein.

While the embodiments are described by way of an example in which the temperature elevating step S302 is performed after the substrate 100 is loaded into the transfer chamber 203, the above-described technique is not limited thereto. For example, the above-described technique may be applied to a case where the substrate 100 is heated in advance by using a substrate processing system 2000 shown in FIG. 16. The substrate processing system 2000 shown in FIG. 16 is configured to process the substrate 100, and is constituted mainly by an I/O stage 2100, an atmospheric transfer chamber 2200, a load lock chamber (L/L chamber) 2300, a vacuum transfer chamber 2400 and substrate processing apparatuses 200a, 200b, 200c and 200d. The vacuum transfer chamber 2400 is connected to the transfer chamber 203 described above via gate valves 1490a, 1490b, 1490c and 1490d. A pod 2001 capable of accommodating substrates including the substrate 100 may be placed on the I/O stage 2100. The vacuum transfer robot 2700 having tweezers 2900 capable of supporting the substrate 100 and an arm 2800 capable of supporting the tweezers 2900 is provided in the vacuum transfer chamber 2400. The substrate 100 and the tweezers 2900 in the vacuum transfer chamber 2400 are heated in advance by a second heater (heating apparatus) 2401 provided in the vacuum transfer chamber 2400. By heating in advance the substrate 100 and the tweezers 2900 in the vacuum transfer chamber 2400, it is possible to suppress the substrate 100 from being distorted or bent when the substrate 100 is placed on the lift pins 207. The atmospheric transfer chamber 2200 is provided with the atmospheric transfer robot 2220 capable of moving the substrate 100 between the pod 2001 placed on the I/O stage 2100 and the load lock chamber 2300.

While the embodiments are described by way of an example in which the substrate 100 is heated, the above-described technique is not limited thereto. For example, the above-described technique may also be applied to change the conditions for neutralizing the substrate 100 (that is, removing electric charges from the substrate 100) after the plasma process is performed on the substrate 100. For example, as the number of layers formed on the substrate 100 increases, the capacitance on the substrate 100 increases and the charge-up problem described above may occur easily. Due to the charge-up problem, the following problems may occur. For example, the substrate 100 may be attached to the substrate support part 210 and as a result, the substrate 100 may be displaced while the substrate 100 is unloaded. In addition, the insulating film formed on the substrate 100 may be destroyed by the charge-up problem. In order to address the above-described problems, a neutralization time for removing the electric charges from the substrate 100 may be changed by adding a step of neutralizing the substrate 100 (that is, a step of removing electric charges from the substrate 100) before protruding the lift pins 207 from the substrate support part 210. For example, as shown in FIG. 17, the neutralization time may be changed based on the substrate data (that is, the number of layers). Specifically, as the number of layers increases, the neutralization time may be lengthened.

While the embodiments are described by way of an example in which the film-forming process is performed using two types of gases, that is the first gas and the second gas, the above-described technique is not limited thereto. For example, the above-described technique may also be applied to a film-forming process using only one type of gas or three or more types of gases.

While the embodiments are described by way of an example in which the film-forming process is performed, the above-described technique is not limited thereto. For example, the above-described technique may also be applied to other processes such as a modification process, an oxidation process, a nitriding process, an oxynitriding process, a reduction process, an oxidation-reduction process, an etching process and a heating process. According to the above-described technique, it is possible to execute various processes by replacing these processes with the above-described film-forming process.

While the embodiments are described by way of an example in which the tungsten-containing film serving as the contact plug film 122 is formed using the tungsten-containing gas as the first gas and the hydrogen-containing gas as the second gas, the above-described technique is not limited thereto. The above-described technique may also be applied to a film-forming process using other gases. For example, the above-described insulating film 102, the second insulating film 105 and/or the sacrificial film 103 may be formed according to the above-described technique using a silicon-containing gas such as hexachlorodisilane ($Si_2Cl_2$, abbreviated as HCDS) gas as the first gas, an oxygen-containing gas such as oxygen ($O_2$) gas as the second gas, and/or a nitrogen-containing gas such as ammonia ($NH_3$) gas as the third gas. In addition, the third insulating film 120 may be formed according to the above-described technique using gases such as a carbon-containing gas and a boron-containing gas, and the conductive film 112 may be formed according to the above-described technique using a metal-containing gas. A gas containing a plurality of elements described above such as silicon (Si), oxygen (O), nitrogen (N), carbon (C), boron (B) and metal element may also be used to form the above-described films according to the above-described technique.

For example, the above-described technique may also be applied to form a layer such as an aluminum (Al)-containing layer, a zirconium (Zr)-containing layer, a hafnium (Hf)-containing layer, a layer containing hafnium and aluminum, a layer containing zirconium and aluminum, a layer containing silicon (Si) and carbon (C), a layer containing silicon, carbon and nitrogen (N), a layer containing silicon, boron (B) and nitrogen, a layer containing titanium (Ti) and nitrogen, a layer containing titanium and carbon, and a layer containing titanium, aluminum and carbon.

While the embodiments are described by way of an example in which the substrate processing apparatus is configured to process one substrate in one process chamber, the above-described technique is not limited thereto. The above-described technique may be applied to other substrate processing apparatuses. For example, the above-described technique may also be applied to a substrate processing apparatus capable of processing a plurality of substrates arranged horizontally.

According to the technique described herein, it is possible to improve the quality of the substrate processing.

What is claimed is:

1. A method of manufacturing a semiconductor device, comprising:
   (a) receiving substrate data comprising a stacked number of layers of a device formed on a substrate or both of the stacked number and a structure of the device;
   (b) setting an apparatus parameter corresponding to the substrate data;
   (c) separating the substrate from a surface of a substrate support by a distance determined by the apparatus parameter and supporting the substrate corresponding to the substrate data above the substrate support;

(d) elevating a temperature of the substrate based on the apparatus parameter while the substrate is separated from the surface of the substrate support;

(e) placing the substrate on the substrate support after (d); and (f) processing the substrate in a process chamber.

2. The method of claim 1, further comprising:

(g) elevating the temperature of the substrate while the substrate is placed on the substrate support after (d), wherein the apparatus parameter used in (d) is different from the apparatus parameter used in (g).

3. The method of claim 2, wherein the apparatus parameter further comprises a time during which the substrate is separated from the surface of the substrate support in (d).

4. The method of claim 3, further comprising:

(h) heating tweezers configured to transfer the substrate based on the substrate data.

5. The method of claim 4, further comprising:

(i) lowering the temperature of the substrate based on the apparatus parameter after (f), wherein a film is formed on the substrate by supplying a process gas to the substrate in (f).

6. The method of claim 3, further comprising:

(i) lowering the temperature of the substrate based on the apparatus parameter after (f), wherein a film is formed on the substrate by supplying a process gas to the substrate in (f).

7. The method of claim 2, further comprising:

(h) heating tweezers configured to transfer the substrate based on the substrate data.

8. The method of claim 1, wherein the apparatus parameter further comprises a time during which the substrate is separated from the surface of the substrate support in (d).

9. The method of claim 8, further comprising:

(h) heating tweezers configured to transfer the substrate based on the substrate data.

10. The method of claim 8, wherein (b) further comprises setting the time based on the stacked number.

11. The method of claim 1, further comprising:

(h) heating tweezers configured to transfer the substrate based on the substrate data.

12. The method of claim 1, wherein a temperature elevating rate of (d) is controlled based on the substrate data such that a difference between a temperature of a front surface of the substrate and a temperature of a back surface of the substrate is within a predetermined range.

13. The method of claim 1, further comprising:

(i) lowering the temperature of the substrate based on the apparatus parameter after (f), wherein a film is formed on the substrate by supplying a process gas to the substrate in (f).

14. A non-transitory computer-readable recording medium storing a program that causes, by a computer, a substrate processing apparatus to perform:

(a) receiving substrate data comprising a stacked number of layers of a device formed on a substrate or both of the stacked number and a structure of the device;

(b) setting an apparatus parameter corresponding to the substrate data;

(c) separating the substrate from a surface of a substrate support by a distance determined by the apparatus parameter and supporting the substrate corresponding to the substrate data above the substrate support;

(d) elevating a temperature of the substrate based on the apparatus parameter while the substrate is separated from the surface of the substrate support;

(e) placing the substrate on the substrate support after (d); and (f) processing the substrate in a process chamber.

15. The non-transitory computer-readable recording medium of claim 14, wherein the program causes the substrate processing apparatus to further perform:

(g) elevating the temperature of the substrate while the substrate is placed on the substrate support after (d), wherein the apparatus parameter used in (d) is different from the apparatus parameter used in (g).

16. The non-transitory computer-readable recording medium of claim 14, wherein the apparatus parameter further comprises a time during which the substrate is separated from the surface of the substrate support in (d).

17. The non-transitory computer-readable recording medium of claim 14, wherein the program causes the substrate processing apparatus to further perform:

(h) heating tweezers configured to transfer the substrate based on the substrate data.

* * * * *